(12) United States Patent
Higashi et al.

(10) Patent No.: US 8,591,993 B2
(45) Date of Patent: Nov. 26, 2013

(54) EPITAXIAL WAFER MANUFACTURING APPARATUS AND MANUFACTURING METHOD

(75) Inventors: Shinya Higashi, Kanagawa-ken (JP); Masashi Aizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 490 days.

(21) Appl. No.: 12/409,387

(22) Filed: Mar. 23, 2009

(65) Prior Publication Data
US 2009/0238971 A1 Sep. 24, 2009

(30) Foreign Application Priority Data

Mar. 24, 2008 (JP) .................................. 2008-076817
Mar. 12, 2009 (JP) .................................. 2009-059202

(51) Int. Cl.
*C23C 16/00* (2006.01)
*C30B 35/00* (2006.01)

(52) U.S. Cl.
USPC ........ 427/255.5; 118/730; 118/724; 118/725; 117/200

(58) Field of Classification Search
None
See application file for complete search history.

(56) References Cited

U.S. PATENT DOCUMENTS

| | | | | | |
|---|---|---|---|---|---|
| 5,248,378 | A | * | 9/1993 | Oda et al. .......................... | 117/217 |
| 6,043,468 | A | * | 3/2000 | Toya et al. ....................... | 219/544 |
| 6,113,705 | A | * | 9/2000 | Ohashi et al. ................... | 118/730 |
| 6,248,672 | B1 | * | 6/2001 | Takagi ............................ | 438/758 |
| 6,250,914 | B1 | * | 6/2001 | Katsumata et al. ................ | 432/5 |
| 6,902,622 | B2 | * | 6/2005 | Johnsgard et al. ............ | 118/715 |
| 2008/0124051 | A1 | * | 5/2008 | Yen ............................... | 386/109 |

FOREIGN PATENT DOCUMENTS

| | | | |
|---|---|---|---|
| JP | 04 096322 | * | 8/1990 |
| JP | 3-14223 | | 1/1991 |
| JP | 4-96322 | | 3/1992 |
| JP | 11-67675 | | 3/1999 |
| JP | 11-219918 | | 8/1999 |
| JP | 2001-140078 | | 5/2001 |
| JP | 2008-60545 | | 3/2008 |

OTHER PUBLICATIONS

U.S. Appl. No. 12/354,530, filed Jan. 15, 2009, to Higashi et al., entitled Apparatus and Method for Manufacturing Epitaxial Wafer.
Notification of Reason(s) for Refusal issued by the Japanese Patent Office on Jan. 24, 2012, for Japanese Patent Application No. 2009-059202, and English-language translation thereof.

* cited by examiner

*Primary Examiner* — Bijay Saha
(74) *Attorney, Agent, or Firm* — Finnegan, Henderson, Farabow, Garrett & Dunner, L.L.P.

(57) ABSTRACT

An epitaxial wafer manufacturing apparatus including: a chamber; a gas introduction port provided in the chamber and configured to introduce a reaction gas into the chamber; a gas exhaust port provided in the chamber and configured to exhaust the reaction gas from inside the chamber; a rotating unit provided inside the chamber; a wafer holder provided in an upper portion of the rotating unit and configured to hold a wafer; and an annular flow-regulating wall being spaced from the rotating unit and the wafer holder, the annular flow-regulating surrounding the upper portion of the rotating unit and a upper portion of the wafer holder, and the annular flow-regulating expanding downward. The flow-regulating wall has an upper end being located above the wafer holder. The upper end has a smaller inner diameter than an outer periphery of the wafer holder. The flow-regulating wall has a lower end being located below an upper surface of the rotating unit. The lower end has a larger inner diameter than an outer periphery of the rotating unit.

12 Claims, 18 Drawing Sheets

EPITAXIAL WAFER MANUFACTURING APPARATUS AND MANUFACTURING METHOD

CROSS-REFERENCE TO RELATED APPLICATIONS

This application is based upon and claims the benefit of priority from the prior Japanese Patent Application No. 2008-076817, filed on Mar. 24, 2008 and the prior Japanese Patent Application No. 2009-059202, filed on Mar. 12, 2009; the entire contents of which are incorporated herein by reference.

BACKGROUND OF THE INVENTION

1. Field of the Invention

This invention relates to an epitaxial wafer manufacturing apparatus and manufacturing method.

2. Background Art

Epitaxial growth for vapor-phase growth of a single crystal film on a semiconductor substrate such as a silicon wafer is often based on the CVD (chemical vapor deposition) method. In an epitaxial wafer manufacturing apparatus based on CVD, for example, a rotating unit is located in a chamber, a wafer holder, which is annular, for example, for holding a wafer is provided on the upper surface of the rotating unit, and a heater for heating the wafer is provided in the rotating unit. A raw material gas is introduced into the chamber to produce a single crystal film on the wafer while rapidly rotating the wafer together with the rotating unit.

In producing a single crystal film on a wafer, if, for example, trichlorosilane is used as a raw material gas and hydrogen is used as a carrier gas, then a reacted gas such as chlorine is generated.

It is desirable that this reacted gas be smoothly exhausted to the exhaust port. However, in conventional epitaxial wafer manufacturing apparatuses, the wafer and the wafer holder are rapidly rotated with the rotating unit, and hence a centrifugal force occurs in the reacted gas. Accordingly, near the outer edge of the rotating unit, this reacted gas has an increased flow velocity toward the outer periphery, which sometimes results in backflow of the reacted gas onto the wafer. The backflow reacted gas etches the silicon film and interferes with improvement in growth rate and gas utilization efficiency.

Furthermore, film formation of multiple layers requires switching the dopant gas concentration and dopant gas species. The conventional epitaxial wafer manufacturing apparatus has poor replacement efficiency of gas in the apparatus, and hence requires a long period of time to switch the concentration or species of the dopant gas. This decreases throughput, and consequently interferes with improvement in the productivity of epitaxial wafers.

In this context, JP-A 2001-140078(Kokai) discloses a technique related to a chemical vapor deposition apparatus. In this technique, a gas flow-regulating plate is provided between the substrate and a gas introducing guide shaped so that its distance to the substrate is gradually narrowed above the substrate. The gas flow-regulating plate serves to prevent circulating flow of the raw material gas to make the film thickness uniform. However, this technique is intended to control the flow of the raw material gas, and cannot control the aforementioned reacted gas.

SUMMARY OF THE INVENTION

According to an aspect of the invention, there is provided an epitaxial wafer manufacturing apparatus including: a chamber; a gas introduction port provided in the chamber and configured to introduce a reaction gas into the chamber; a gas exhaust port provided in the chamber and configured to exhaust the reaction gas from inside the chamber; a rotating unit provided inside the chamber; a wafer holder provided in an upper portion of the rotating unit and configured to hold a wafer; and an annular flow-regulating wall being spaced from the rotating unit and the wafer holder, the annular flow-regulating surrounding the upper portion of the rotating unit and a upper portion of the wafer holder, and the annular flow-regulating expanding downward, the flow-regulating wall having an upper end being located above the wafer holder, the upper end having a smaller inner diameter than an outer periphery of the wafer holder, and the flow-regulating wall having a lower end being located below an upper surface of the rotating unit, the lower end having a larger inner diameter than an outer periphery of the rotating unit.

According to another aspect of the invention, there is provided an epitaxial wafer manufacturing apparatus including: a chamber; a gas introduction port provided in the chamber and configured to introduce a reaction gas into the chamber; a gas exhaust port provided in the chamber and configured to exhaust the reaction gas from inside the chamber; a rotating unit provided inside the chamber; and a wafer holder provided in an upper portion of the rotating unit and configured to hold a wafer, the chamber having an inner wall, the inner wall having an annular flow-regulating wall being spaced from the rotating unit and the wafer holder, the annular flow-regulating wall surrounding the rotating unit and the wafer holder, the annular flow-regulating wall expanding downward, the flow-regulating wall having an upper end being located above the wafer holder, the upper end having a smaller inner diameter than an outer periphery of the wafer holder, and the flow-regulating wall having a lower end being located below the upper surface of the rotating unit, the lower end having a larger inner diameter than an outer periphery of the rotating unit.

According to another aspect of the invention, there is provided an epitaxial wafer manufacturing apparatus including: a chamber; a gas introduction port provided in the chamber and configured to introduce a reaction gas into the chamber; a gas exhaust port provided in the chamber and configured to exhaust the reaction gas from inside the chamber; a rotating unit provided inside the chamber; a wafer holder provided in an upper portion of the rotating unit and configured to hold a wafer; and an annular flow-regulating wall being spaced from the rotating unit and the wafer holder, the annular flow-regulating wall surrounding the upper portion of the rotating unit and a upper portion of the wafer holder, the annular flow-regulating wall expanding downward, the flow-regulating wall having an upper end being located above the wafer holder, the upper end having a smaller inner diameter than an outer periphery of the wafer holder, the flow-regulating wall including a first heater.

According to another aspect of the invention, there is provided an epitaxial wafer manufacturing method including: placing a wafer on a wafer holder located in an upper portion of a rotating unit provided inside a chamber; introducing a reaction gas into the chamber while rotating the wafer by the rotating unit; and forming an epitaxial film on the wafer while regulating flow of the reaction gas from a position above the wafer holder and inside an outer periphery of the wafer holder to a position below an upper surface of the rotating unit and outside an outer periphery of the rotating unit.

DETAILED DESCRIPTION OF THE INVENTION

Figure 1:
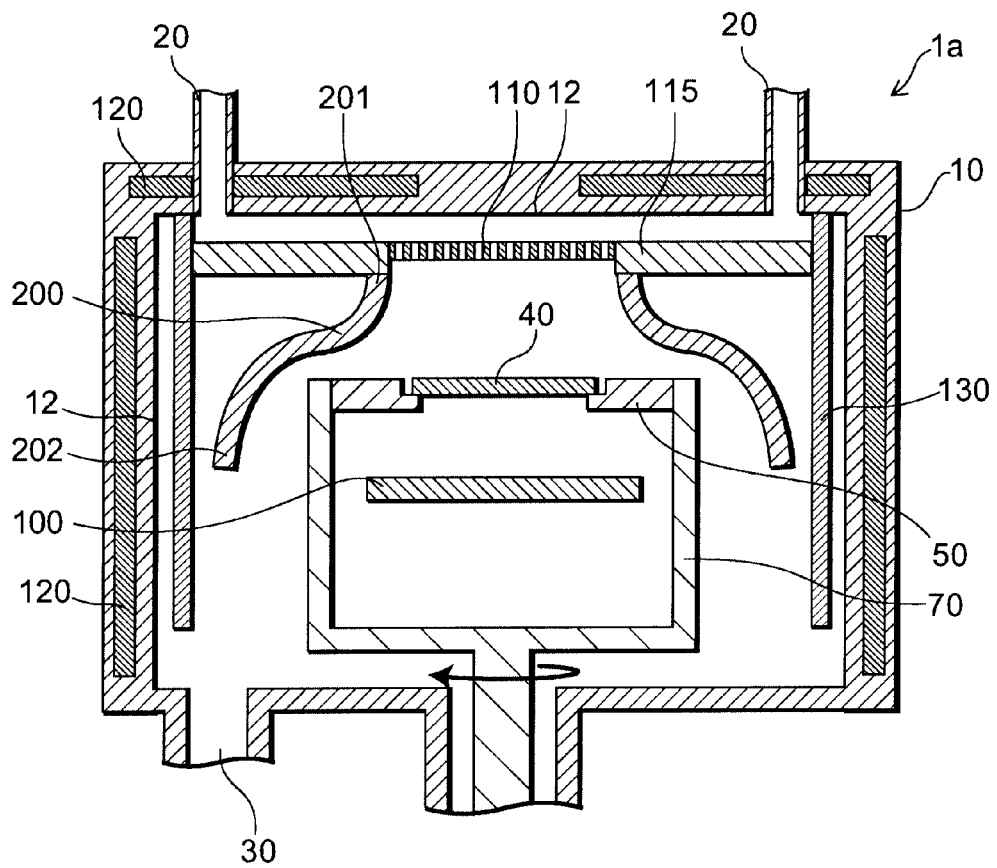
FIG. 1 is a schematic cross-sectional view illustrating the configuration of an epitaxial wafer manufacturing apparatus according to a first embodiment of the invention.

Embodiments of the invention will now be described in detail with reference to the drawings.

In the present specification and drawings, the same elements as those described previously with reference to earlier figures are labeled with like reference numerals, and the detailed description thereof is omitted as appropriate.

First Embodiment

FIG. 1 is a schematic cross-sectional view illustrating the configuration of an epitaxial wafer manufacturing apparatus according to a first embodiment of the invention.

As shown in FIG. 1, the epitaxial wafer manufacturing apparatus 1a according to the first embodiment includes a chamber 10. A rotating unit 70 is provided inside the chamber 10, and a wafer holder 50 for holding a wafer 40 is provided on the upper surface of the rotating unit 70. In FIG. 1, the wafer holder 50 illustratively has an annular shape, such as a ring shape, in plan view (as viewed from top to bottom parallel to the page in FIG. 1). The wafer 40 is held by the wafer holder 50 and rotated by the rotating unit 70.

A gas introduction port 20 for introducing a reaction gas (such as a raw material gas and a carrier gas) into the chamber 10 is provided in the upper portion, for example, of the chamber 10, and a gas exhaust port 30 for exhausting the reaction gas (reacted gas) is provided in the lower portion, for example, of the chamber 10. Furthermore, a cooling pipe 120 for circulating a coolant, such as cooling water, is provided in the outer wall of the chamber 10.

A flow-regulating plate 110 supported by an adapter 115 is provided in the upper portion of the rotating unit 70 so that the reaction gas introduced from the gas introduction port 20 can be uniformly regulated and introduced toward the wafer 40. The flow-regulating plate 110 can be illustratively made of quartz. However, the invention is not limited thereto, but the flow-regulating plate 110 can be made of various materials which are highly heat-resistant and chemically stable. Furthermore, the flow-regulating plate 110 and the adapter 115 described above are optional, and may be omitted in the case where, for example, the space above the wafer holder 50 to the inner wall 12 of the chamber 10 is narrow. Alternatively, other components can double as the flow-regulating plate 110 and the adapter 115.

In the epitaxial wafer manufacturing apparatus 1a illustrated in FIG. 1, on the inner wall 12 of the chamber 10 is provided a liner 130 for preventing contamination from the inner wall 12 to the wafer 40 and simultaneously preventing reaction products from adhering to the inner wall 12. The liner 130 can be made of various materials such as quartz, SiC, and silicon, as well as carbon coated with SiC film. It is noted that the liner 130 can be made of other materials. Furthermore, the liner 130 is optional, and another component can double as the liner 130. In the epitaxial wafer manufacturing apparatus 1a, the adapter 115 is held on the chamber 10 via the liner 130. However, the invention is not limited thereto. For example, the flow-regulating plate 110 and the adapter 115 may be directly connected to the chamber 10 without the intermediary of the liner 130.

Inside the rotating unit 70 is provided an internal heater 100 (third heater) for heating the wafer 40. The internal heater 100 can illustratively have a disk or annular shape. Depending on the circumstances, a heater is provided not only inside the rotating unit 70 but also outside. For example, these heaters can be made of graphite sandwiched between quartz layers, or can be resistance-heating heaters made of SiC.

Furthermore, the epitaxial wafer manufacturing apparatus 1a according to this embodiment includes a flow-regulating wall 200 with the upper end connected to the adapter 115. The upper end 201 of the flow-regulating wall 200 is located above the wafer holder 50 and inside the outer periphery of the wafer holder 50. The lower end 202 of the flow-regulating wall 200 is located below the upper surface of the rotating unit 70 and outside the outer periphery of the rotating unit 70.

In other words, the epitaxial wafer manufacturing apparatus 1a according to this embodiment includes an annular flow-regulating wall 200, which is spaced from the rotating unit 70 and the wafer holder 50, surrounds the upper portion thereof, and expands downward. The upper end of the flow-regulating wall 200 is located above the wafer holder 50 and has a smaller inner diameter than the outer periphery of the wafer holder 50. The lower end of the flow-regulating wall 200 is located below the upper surface of the rotating unit 70 and has a larger inner diameter than the outer periphery of the rotating unit 70.

That is, the surface (inner surface) of the flow-regulating wall 200 facing the rotating unit 70 is in close proximity to the outer periphery of the upper portion of the rotating unit 70. In other words, the vertical length of the space above the rotating unit 70 at the outer periphery of the rotating unit 70 is shorter than the vertical length of the space above the rotating unit 70 at the rotation center of the rotating unit 70.

Furthermore, the inner surface of the flow-regulating wall 200 is in close proximity to the side surface of the upper portion of the rotating unit 70. That is, the horizontal (outward from the rotation center of the rotating unit 70) distance of the space outside the side surface of the rotating unit 70 at the upper portion of the rotating unit 70 is shorter than the horizontal distance of the space outside the side surface of the rotating unit at the lower portion of the rotating unit 70.

The flow-regulating wall 200 can be made of various materials such as quartz, SiC, and silicon, as well as carbon coated with SiC film.

In the epitaxial wafer manufacturing apparatus thus configured, for example, a mixed gas of trichlorosilane ($SiHCl_3$) serving as a raw material gas and hydrogen ($H_2$) serving as a carrier gas is introduced as a reaction gas from the gas introduction port 20, and an epitaxial film is formed on the wafer 40 maintained at a high temperature while the wafer 40 is rotated by the rotating unit 70.

That is, the reaction gas introduced into the chamber flows onto the upper surface of the wafer 40 through the flow-regulating plate 110 held on the adapter 115. The reaction gas introduced forms an epitaxial film on the wafer 40 heated to a high temperature.

At this time, in the case where, for example, the raw material gas and the carrier gas are trichlorosilane and hydrogen, respectively, the chemical reaction represented by the following reaction formula occurs as the overall reaction:

$$SiHCl_3 + H_2 \rightarrow Si + 3HCl$$

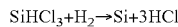

Si on the right-hand side of the above formula is produced as a silicon film on the wafer surface. As indicated by this chemical reaction, hydrogen chloride (HCl) gas is generated simultaneously with the production of Si. If the reacted gas containing this hydrogen chloride gas (in this case, the reacted gas contains the remaining raw material gas, remaining carrier gas, hydrogen chloride gas, and intermediate product gas) is not smoothly exhausted but remains in the apparatus, then, for example, it etches the Si film and interferes with improvement in film formation rate and gas utilization efficiency. However, because the epitaxial wafer manufacturing apparatus 1a according to this embodiment includes the flow-regulating wall 200, this reacted gas can be efficiently exhausted.

More specifically, the flow-regulating wall 200 provided in the epitaxial wafer manufacturing apparatus 1a according to this embodiment narrows the gap between the flow-regulating wall 200 and the upper surface and the outer side surface of the rotating unit 70, and hence increases the viscous drag of the reacted gas. Hence, the flow rate of the reacted gas toward the outer periphery can be decreased, and the backflow of the reacted gas can be reduced. This serves to improve film formation rate and gas utilization efficiency on the wafer.

Furthermore, this embodiment reduces the backflow of the reacted gas to eliminate its stagnation, reduces the volume of the space where the reacted gas flows, and improves the efficiency of guiding the reacted gas to the gas exhaust port 30. This serves to improve the gas replacement efficiency and the productivity.

First Comparative Example

In the following, an epitaxial wafer manufacturing apparatus 9a of a first comparative example is described.

The epitaxial wafer manufacturing apparatus 9a of the first comparative example has a structure which is the same as that of the epitaxial wafer manufacturing apparatus 1a illustrated in FIG. 1 except that no flow-regulating wall 200 is provided. The configuration other than the foregoing is the same as that of the epitaxial wafer manufacturing apparatus 1a, and hence the detailed description thereof is omitted.

Figure 2:
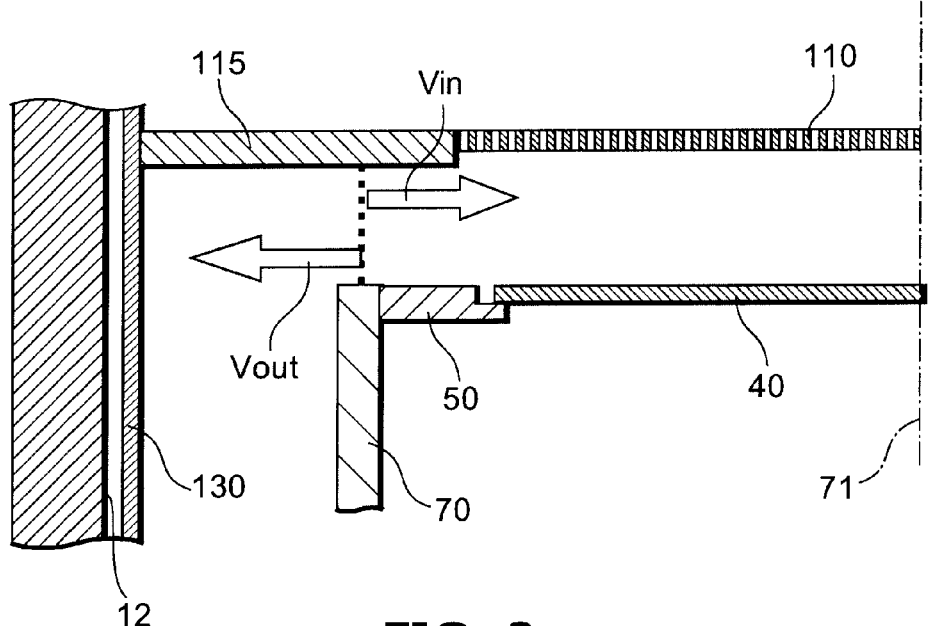
FIG. 2 is a cross-sectional schematic view illustrating the state of the reacted gas in an epitaxial wafer manufacturing apparatus of a first comparative example.

FIG. 2 is a cross-sectional schematic view illustrating the state of the reacted gas in the epitaxial wafer manufacturing apparatus of the first comparative example.

This figure illustrates a relevant part of the epitaxial wafer manufacturing apparatus 9a of the first comparative example, illustrating the flow-regulating plate 110, the adapter 115, the rotating unit 70, the wafer holder 50, and the wafer 40 on the left side of the rotation center line 71 of the rotating unit 70.

The epitaxial wafer manufacturing apparatus 9a of the first comparative example includes no flow-regulating wall 200, and hence has a wide gap between the wafer holder 50 and the adapter 115.

Furthermore, as shown in FIG. 2, because the wafer 40 and the wafer holder 50 are rapidly rotated with the rotating unit 70, a centrifugal force occurs in the reaction gas. Thus, near the outer edge of the rotating unit 70, the reaction gas has an increased flow velocity toward the outer periphery. Hence, near the outer periphery of the rotating unit 70, the flow rate $V_{out}$ toward the outer periphery increases.

At this time, in this example, the reacted gas flowing toward the outer periphery is caused to flow toward the gas exhaust port 30 by passing between the adapter 115 and the wafer holder 50 and between the liner 130 and the sidewall of the rotating unit 70. However, at an excessively high flow rate $V_{out}$ toward the outer periphery, the flow capacity toward the gas exhaust port 30 is exceeded, which results in backflow, for example, near the adapter 115 above the rotating unit 70. That is, the flow rate $V_{in}$ (backflow rate $V_{in}$) of the reacted gas toward the inner periphery increases. This backflow rate $V_{in}$ is the difference between the flow rate $V_{out}$ toward the outer periphery and the flow capacity toward the gas exhaust port 30, and as the flow rate $V_{out}$ toward the outer periphery increases, the backflow rate $V_{in}$ also increases. If the reacted gas containing hydrogen chloride gas flows back onto the wafer 40, the silicon film is etched, which results in decreased film formation rate and gas utilization efficiency.

Furthermore, in film formation of multiple layers, the backflow of the reacted gas causes switching of the dopant gas to require a long period of time. That is, the replacement efficiency of gas in the apparatus is decreased. This results in decreased throughput and interferes with improvement in the productivity of epitaxial wafers.

Second Comparative Example

Figure 3:
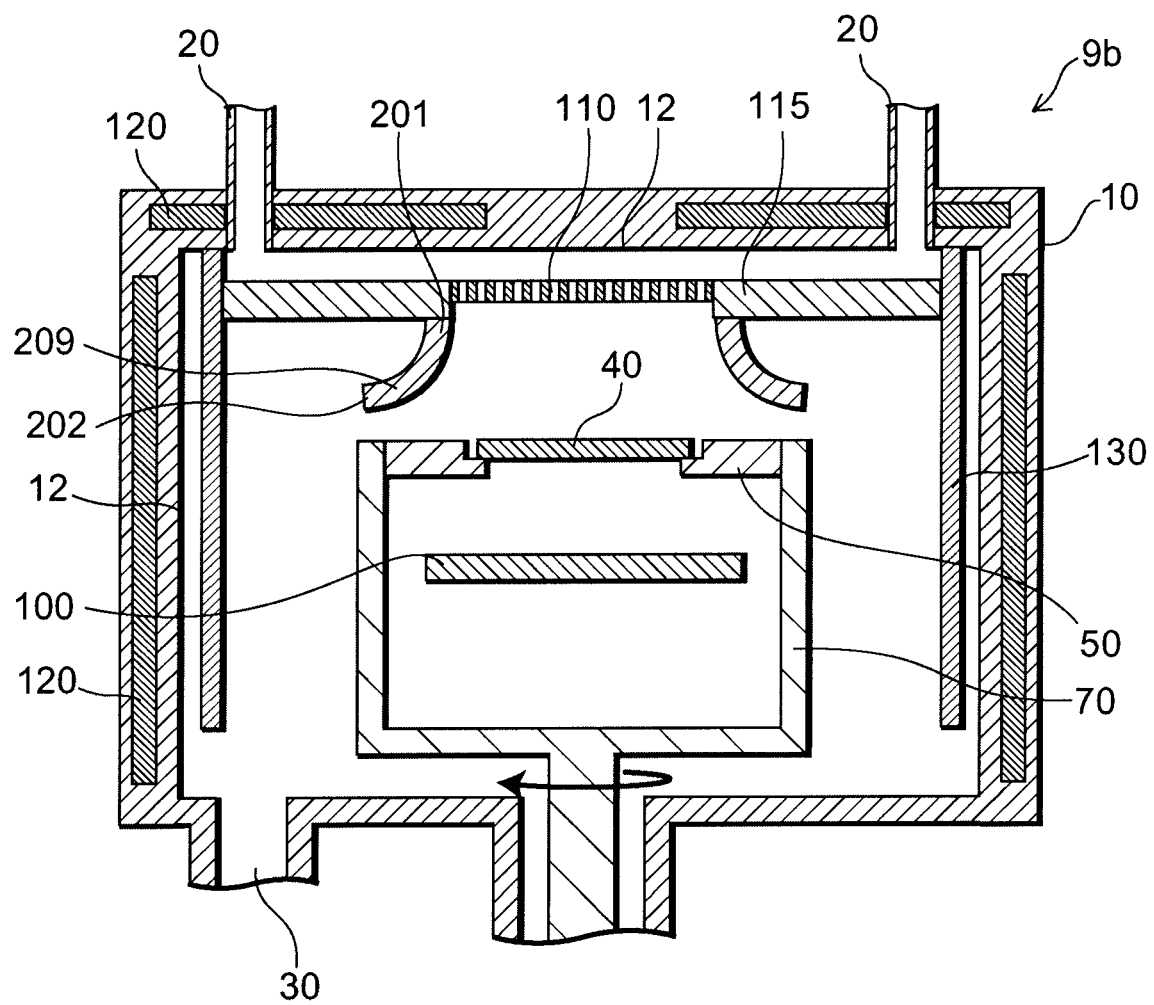
FIG. 3 is a schematic cross-sectional view illustrating the configuration of an epitaxial wafer manufacturing apparatus of a second comparative example.

FIG. 3 is a schematic cross-sectional view illustrating the configuration of an epitaxial wafer manufacturing apparatus of a second comparative example.

As shown in FIG. 3, the epitaxial wafer manufacturing apparatus 9b of the second comparative example includes a flow-regulating wall 209. However, this flow-regulating wall 209 is provided only above the rotating unit 70. That is, the upper end 201 of the flow-regulating wall 209 is located above the wafer holder 50 and inside the outer periphery of the wafer holder 50, but the lower end 202 of the flow-regulating wall 209 is located above the upper surface of the rotating unit 70. The configuration other than the structure of this flow-regulating wall 209 is the same as that of the epitaxial wafer manufacturing apparatus 1a illustrated in FIG. 1, and hence the description thereof is omitted.

Thus, in the epitaxial wafer manufacturing apparatus 9b of the second comparative example, the flow-regulating wall 209 is provided only above the rotating unit 70. Hence, the reacted gas flows back upward from the lower end 202 of the flow-regulating wall 209 and stagnates in the chamber. This causes switching of the dopant gas to require a long period of time and results in decreasing the replacement efficiency of gas in the apparatus. This decreases throughput and interferes with improvement in the productivity of epitaxial wafers.

In the following, a detailed description is given of the characteristics of the epitaxial wafer manufacturing apparatus 1a according to this embodiment and the epitaxial wafer manufacturing apparatuses 9a, 9b of the first and second comparative example.

FIG. 4 is a schematic view illustrating the flow of the reacted gas in the epitaxial wafer manufacturing apparatuses of the first embodiment and the first and second comparative example.

Figure 4A:
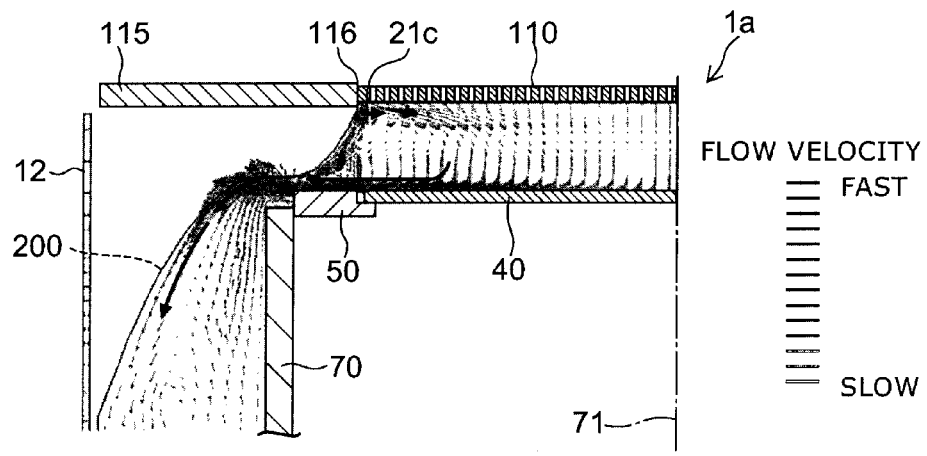
FIGS. 4A to 4C are schematic views illustrating the flow of the reacted gas in the epitaxial wafer manufacturing apparatuses of the first embodiment and the first and second comparative example.
Figure 4B:
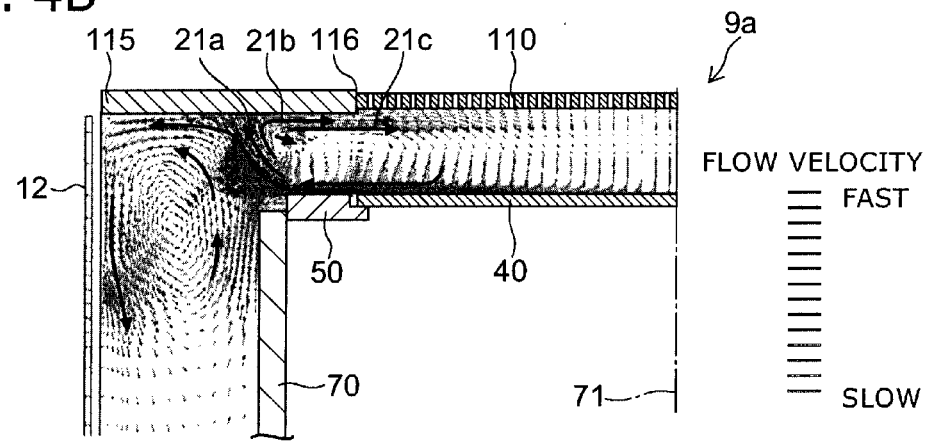
Figure 4C:
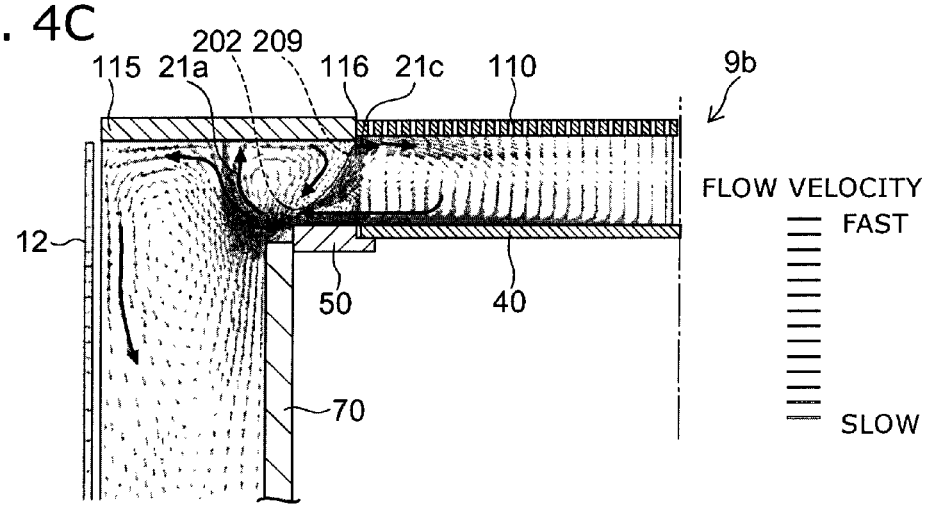

More specifically, FIGS. 4A, 4B, and 4C illustrate numerical analysis results for the flow of the reacted gas in the epitaxial wafer manufacturing apparatus 1a according to the first embodiment and the epitaxial wafer manufacturing apparatuses 9a, 9b of the first and second comparative example, respectively.

In these figures, besides large arrows, numerous small arrows are depicted. The numerous small arrows indicate the direction and speed of gas flow at their positions in the apparatus, with the velocity component in the rotational direction being omitted. That is, the arrow with a dark shade represents a fast flow, the arrow with a light shade represents a slow flow, and the arrow with an intermediate shade represents a flow with an intermediate speed. On the other hand, the large arrow in the figure summarizes the direction of gas flow represented by the aforementioned small arrows.

As shown in FIG. 4B, in the epitaxial wafer manufacturing apparatus 9a of the first comparative example, an upward flow 21a of the reacted gas having a high flow velocity is observed above the outer periphery of the rotating unit 70. Furthermore, a backflow 21b of the reacted gas is observed in the space near the adapter 115 above the rotating unit 70. That is, the reacted gas has a high backflow rate $V_{in}$ in the space near the adapter 115 above the rotating unit 70. For example, the flow 21c of the reacted gas below the boundary 116 between the adapter 115 and the flow-regulating plate 110 is directed toward the inner periphery (rightward in the figure) with a high flow velocity.

As shown in FIG. 4C, in the epitaxial wafer manufacturing apparatus 9b of the second comparative example, because of the presence of the flow-regulating wall 209, for example, the flow 21c of the reacted gas below the boundary 116 between the adapter 115 and the flow-regulating plate 110 is decreased, and a certain improvement is seen relative to the first comparative example. However, in the second comparative example, an upward flow 21a from the lower end 202 of the flow-regulating wall 209 is observed, and the reacted gas stagnates in the chamber. That is, this upward flow 21a prevents the reacted gas from smoothly flowing downward from the space between the wafer holder 50 and the adapter 115 to the space between the rotating unit 70 and the liner 130, and results in a low exhaust efficiency of the reacted gas.

In contrast, as shown in FIG. 4A, in the epitaxial wafer manufacturing apparatus 1a according to this embodiment, the reacted gas smoothly flows downward along the flow-regulating wall 200 from the space above the wafer 40 toward the side surface of the rotating unit 70. For example, the flow 21c of the reacted gas below the boundary 116 between the adapter 115 and the flow-regulating plate 110 has a low backflow rate $V_{in}$. Thus, there is no substantial stagnation of the reacted gas.

Furthermore, there is no upward flow at the lower end 202 of the flow-regulating wall 200. Thus, the reacted gas smoothly flows downward from the space between the wafer holder 50 and the adapter 115 to the space between the rotating unit 70 and the liner 130, and hence leads to a high exhaust efficiency of the reacted gas.

As an indicator expressing the flow regulation performance of the reacted gas in these apparatuses, a comparison was made on the backflow rate $V_{in}$ of the flow 21c of the reacted gas at the boundary 116 between the adapter 115 and the flow-regulating plate 110. It was then found that the backflow rate $V_{in}$ of the reacted gas in the epitaxial wafer manufacturing apparatus 1a according to this embodiment is reduced by 59% relative to the epitaxial wafer manufacturing apparatus 9a of the first comparative example.

This can be understood as follows. The epitaxial wafer manufacturing apparatus 1a according to this embodiment includes a flow-regulating wall 200. Hence, the vertical gap of space which the upper surface of the rotating unit 70 and the upper surface of the wafer holder 50 form with the flow-regulating wall 200 is narrower than in the first comparative example. It is considered that this increases the viscous drag of the reacted gas, decreases the flow rate $V_{out}$ toward the outer periphery, and results in the reduced backflow rate $V_{in}$ toward the inner periphery.

On the other hand, in the epitaxial wafer manufacturing apparatus 9b of the second comparative example, because of the presence of the flow-regulating wall 209, the backflow rate $V_{in}$ of the reacted gas is as small as in the epitaxial wafer manufacturing apparatus 1a according to this embodiment. However, in the manufacturing apparatus 9b, the lower end of the flow-regulating wall 209 is located above the upper surface of the rotating unit 70. Hence, as specifically described below, the reacted gas is not smoothly exhausted but stagnates in the chamber 10.

FIG. 5 is a schematic view illustrating the mean age of air in the epitaxial wafer manufacturing apparatuses of the first embodiment and the first and second comparative example.

Figure 5A:
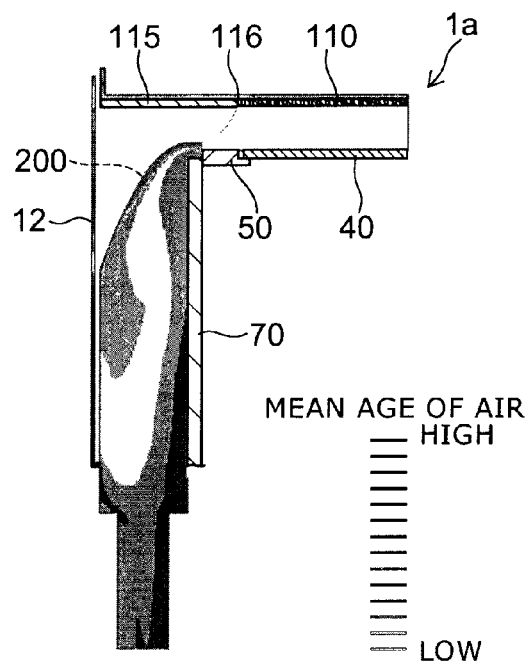
FIGS. 5A to 5C are schematic views illustrating the mean age of air in the epitaxial wafer manufacturing apparatuses of the first embodiment and the first and second comparative example.
Figure 5B:
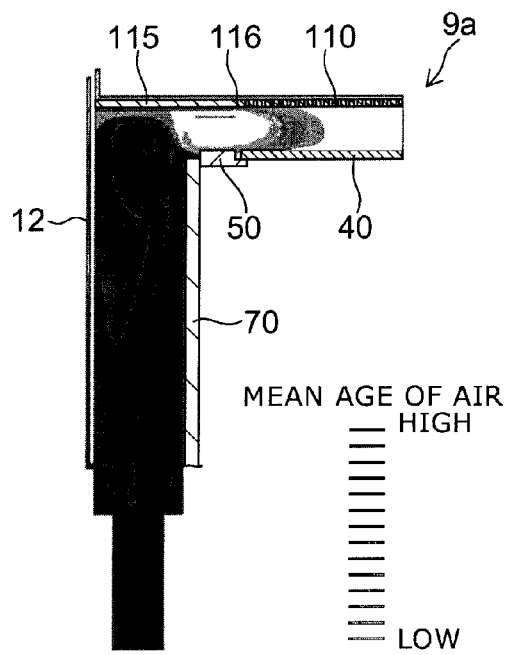
Figure 5C:
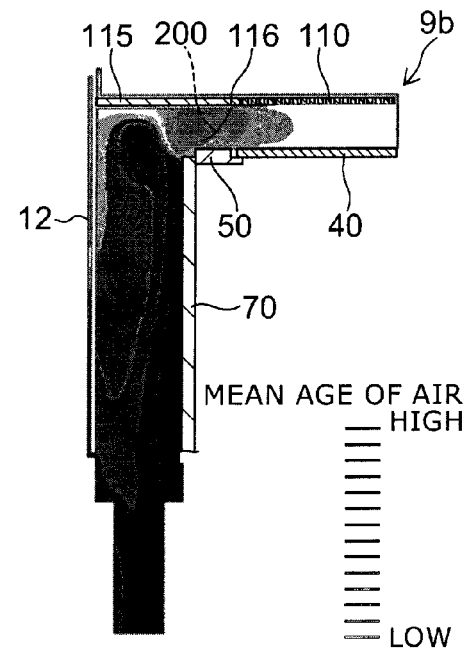

More specifically, FIGS. 5A, 5B, and 5C illustrate numerical analysis results for the mean age of air in the epitaxial wafer manufacturing apparatus 1a according to the first embodiment and the epitaxial wafer manufacturing apparatuses 9a, 9b of the first and second comparative example, respectively. Here, the mean age of air refers to the average time taken until the gas flowing into the system reaches a certain point. That is, higher mean age of air represents better replacement efficiency in the apparatus.

In the figure, the dark hatched region represents a high mean age of air, the light hatched region represents a low mean age of air, and the region hatched with an intermediate shade represents an intermediate mean age of air.

In the epitaxial wafer manufacturing apparatus, high gas replacement efficiency is desired particularly above the rotating unit 70 and above the wafer holder 50. That is, a low mean of age is desired particularly above the rotating unit 70 and above the wafer holder 50.

As shown in FIG. 5B, in the epitaxial wafer manufacturing apparatus 9a of the first comparative example, the mean of age is high above the outer periphery of the rotating unit 70 and the wafer holder 50. That is, the ventilation efficiency of the apparatus is low.

As shown in FIG. 5C, also in the epitaxial wafer manufacturing apparatus 9b of the second comparative example, the mean of age is high above the outer periphery of the rotating unit 70 and the wafer holder 50, and the ventilation efficiency of the apparatus is low.

In contrast, as shown in FIG. 5A, in the epitaxial wafer manufacturing apparatus 1a according to this embodiment, the mean of age is low throughout the apparatus, particularly above the outer periphery of the rotating unit 70 and the wafer holder 50. That is, the ventilation efficiency of the apparatus is high.

As an indicator expressing the exhaust efficiency in these apparatuses, a comparison was made on the maximum of the mean age of air above the rotating unit 70, that is, the mean age of air on a plane where the boundary 116 between the adapter 115 and the flow-regulating plate 110 is extended from the adapter 115 to the wafer holder 50. It was then found that the maximum of the mean age of air in the epitaxial wafer manufacturing apparatus 1a according to this embodiment is reduced by 72% relative to the first comparative example including no flow-regulating wall 200, and reduced by 47% relative to the epitaxial wafer manufacturing apparatus 9b of the second comparative example where the lower end of the flow-regulating wall 209 is located above the upper surface of the rotating unit 70.

This can be understood as follows. The presence of the flow-regulating wall 200 reduces the backflow of the reacted gas to eliminate its stagnation, reduces the volume of the space where the reacted gas flows, improves the efficiency of guiding the gas to the gas exhaust port 30, and decreases the distance between the flow-regulating wall 200 and the rotating unit 70. Thus, the lower space with a high mean age of air (the space between the side surface of the rotating unit 70 and the liner 130) can be separated from the space above the wafer holder 50. It is considered that this results in the aforementioned reduction in the maximum of the mean age of air.

Thus, in the epitaxial wafer manufacturing apparatus 1a according to the first embodiment, by providing the flow-regulating wall 200, the gas flow inside the apparatus is regulated, and the backflow rate onto the wafer and the mean age of air can be significantly reduced. That is, this embodiment can provide an epitaxial wafer manufacturing apparatus with high productivity by improving film formation rate, gas utilization efficiency, and gas replacement efficiency.

As illustrated in FIG. 1, in the epitaxial wafer manufacturing apparatus 1a according to this embodiment, the flow-regulating wall 200 has an annular shape with the diameter being narrow at the upper end and wide at the lower end. Furthermore, the upper end of the flow-regulating wall 200 is in communication with the inner wall 12 of the chamber 10, that is, in this example, in communication with the inner wall 12 of the chamber 10 through the adapter 115.

If the flow-regulating wall 200 is thus annular and its upper end is spaced from the adapter 115 (and the inner wall 12 of the chamber 10 in communication therewith), then, for example, the reaction gas introduced above the wafer holder 50 through the flow-regulating plate 110 flows, at the upper end of the flow-regulating wall 200, not only onto the surface of the flow-regulating wall 200 facing the rotating unit 70 but also onto the surface of the flow-regulating wall 200 facing the chamber 10, decreasing the utilization efficiency of the reaction gas. Furthermore, if the lower end of the flow-regulating wall 200 is spaced from the liner 130 as illustrated in FIG. 1 and the upper end is spaced from the adapter 115, then the reacted gas flows back upward from the lower end of the flow-regulating wall 200, passes through the upper end of the flow-regulating wall, and flows back toward the wafer 40.

To prevent this, in the case where the flow-regulating wall 200 has an annular shape as in the epitaxial wafer manufacturing apparatus 1a according to this embodiment, the upper end of the flow-regulating wall 200 is preferably in communication with the inner wall 12 of the chamber 10. This includes the case where the upper end of the flow-regulating wall 200 is in communication with the inner wall 12 of the chamber 10 through another member such as the adapter 115. In other words, what is needed is to prevent the reaction gas from flowing into the space on the outside of the flow-regulating wall 200 (facing the chamber 10), and to prevent backflow of the reacted gas to the wafer 40 side through the outside of the flow-regulating wall 200.

That is, in the epitaxial wafer manufacturing apparatus 1a according to this embodiment, substantially all the reaction gas introduced from the gas introduction port 20 passes through the opening at the upper end of the flow-regulating wall 200 and the gap between the flow-regulating wall 200 and the rotating unit 70.

It is noted that, as described later, the upper end of the flow-regulating wall 200 is not necessarily in communication with the inner wall 12 of the chamber 10, as long as the outer surface of the flow-regulating wall 200 is in abutment with or close proximity to the chamber 10, the liner 130, and the adapter 115 so that the space on the outside of the flow-regulating wall 200 is narrow enough to prevent the reaction gas and the reacted gas from flowing into the space.

In the epitaxial wafer manufacturing apparatus 1a illustrated in FIG. 1, the upper portion of the surface (inner surface) of the flow-regulating wall 200 facing the rotating unit 70 has a shape convex toward the rotating unit. Furthermore, the lower portion of the surface of the flow-regulating wall 200 facing the rotating unit 70 has a shape concave toward the rotating unit 70. This serves to regulate both the reaction gas and the reacted gas so that the backflow of the reacted gas can be efficiently reduced. However, as described later, the invention is not limited thereto, but the inner surface of the flow-regulating wall 200 may have a linear cross-sectional shape.

Furthermore, in the epitaxial wafer manufacturing apparatus 1a illustrated in FIG. 1, the surface of the flow-regulating wall 200 facing the rotating unit 70 is a continuous curved surface. This serves to prevent local stagnation of the reaction gas and the reacted gas so that the backflow of the reacted gas can be efficiently reduced. However, as described later, the invention is not limited thereto, but the inner surface of the flow-regulating wall 200 may have a discontinuous cross-sectional shape.

In the following, variations of the epitaxial wafer manufacturing apparatus according to this embodiment are described.

Figure 6:
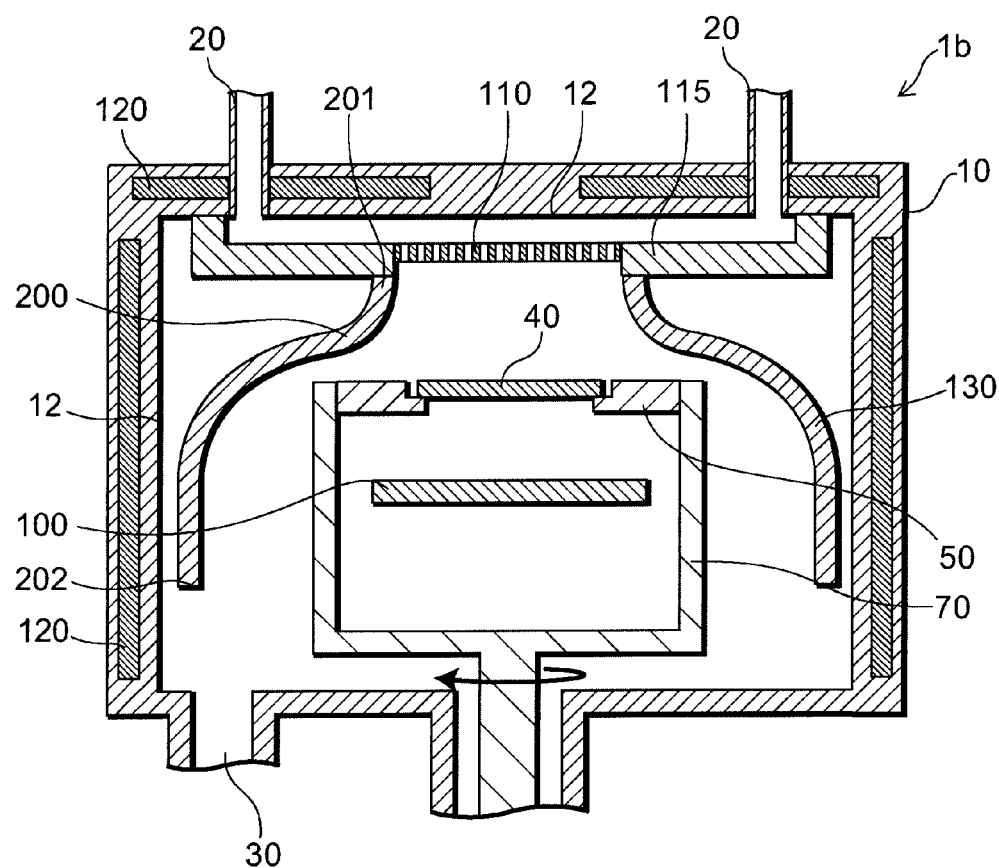
FIG. 6 is a schematic cross-sectional view illustrating the configuration of a variation of the epitaxial wafer manufacturing apparatus according to the first embodiment of the invention.

FIG. 6 is a schematic cross-sectional view illustrating the configuration of a variation of the epitaxial wafer manufacturing apparatus according to the first embodiment of the invention.

As shown in FIG. 6, in the epitaxial wafer manufacturing apparatus 1b of the variation according to this embodiment, the flow-regulating wall 200 illustratively doubles as a liner.

Also in this configuration, the backflow rate onto the wafer and the mean age of air can be significantly reduced. Thus, this configuration can provide an epitaxial wafer manufacturing apparatus with high productivity by improving film formation rate, gas utilization efficiency, and gas replacement efficiency.

Furthermore, because the flow-regulating wall 200 doubles as a liner, the number of components is decreased. This provides various advantages such as easy maintenance and cost reduction of the apparatus.

Figure 7:
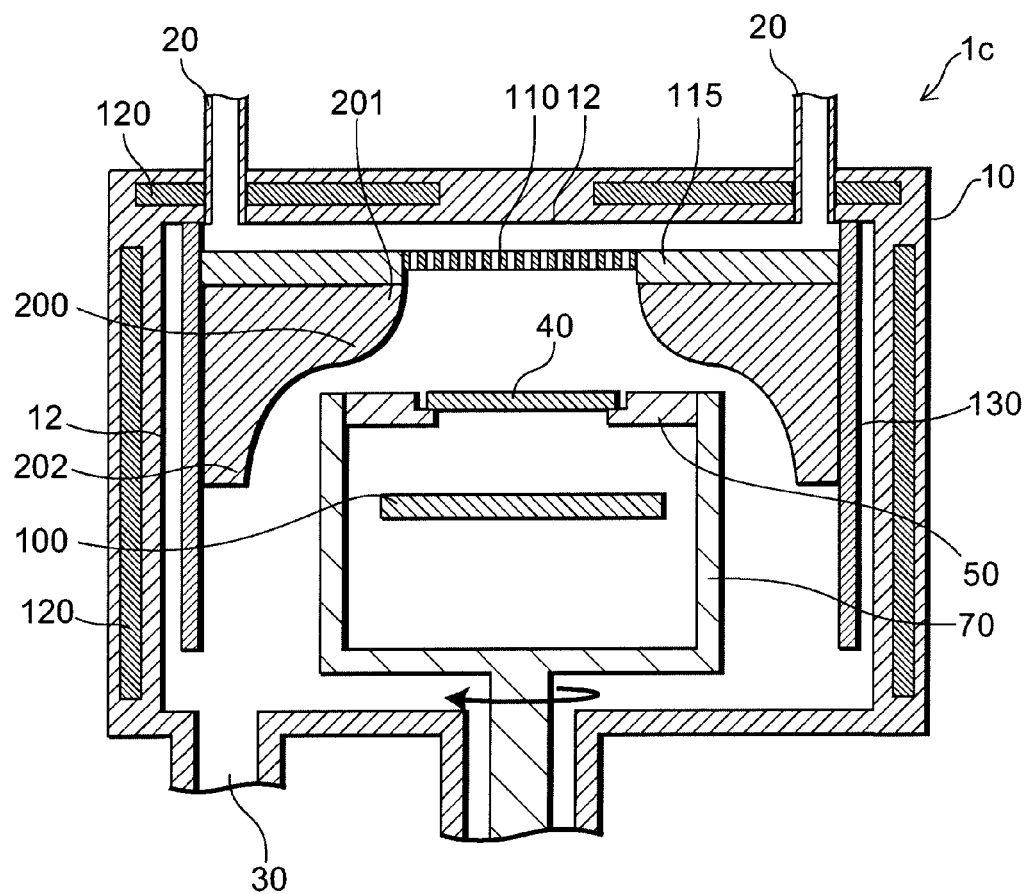
FIG. 7 is a schematic cross-sectional view illustrating the configuration of an another variation of the epitaxial wafer manufacturing apparatus according to the first embodiment of the invention.

FIG. 7 is a schematic cross-sectional view illustrating the configuration of another variation of the epitaxial wafer manufacturing apparatus according to the first embodiment of the invention.

As shown in FIG. 7, in the epitaxial wafer manufacturing apparatus 1c of the another variation according to this embodiment, the flow-regulating wall 200 is configured so that the outer peripheral surface has a cylindrical shape and the diameter of the lower end of the inner peripheral surface is wider than the diameter of the upper end. That is, the outer surface of the flow-regulating wall 200 is in abutment with or close proximity to the chamber 10, the liner 130, and the adapter 115.

Also in this configuration, the backflow rate onto the wafer and the mean age of air can be significantly reduced. Thus, this configuration can provide an epitaxial wafer manufacturing apparatus with high productivity by improving film formation rate, gas utilization efficiency, and gas replacement efficiency.

In this configuration of the flow-regulating wall 200, the outer peripheral surface has a cylindrical shape, and the diameter of the lower end of the inner peripheral surface is wider than the diameter of the upper end. Thus, the outer surface of the flow-regulating wall 200 is in abutment with or close proximity to the chamber 10, the liner 130, and the adapter 115. Hence, the temperature of the flow-regulating wall 200 decreases, and the amount of film adhered to the flow-regulating wall 200 can be reduced. Thus, the frequency of maintenance of the apparatus can be reduced.

Second Embodiment

Figure 8:
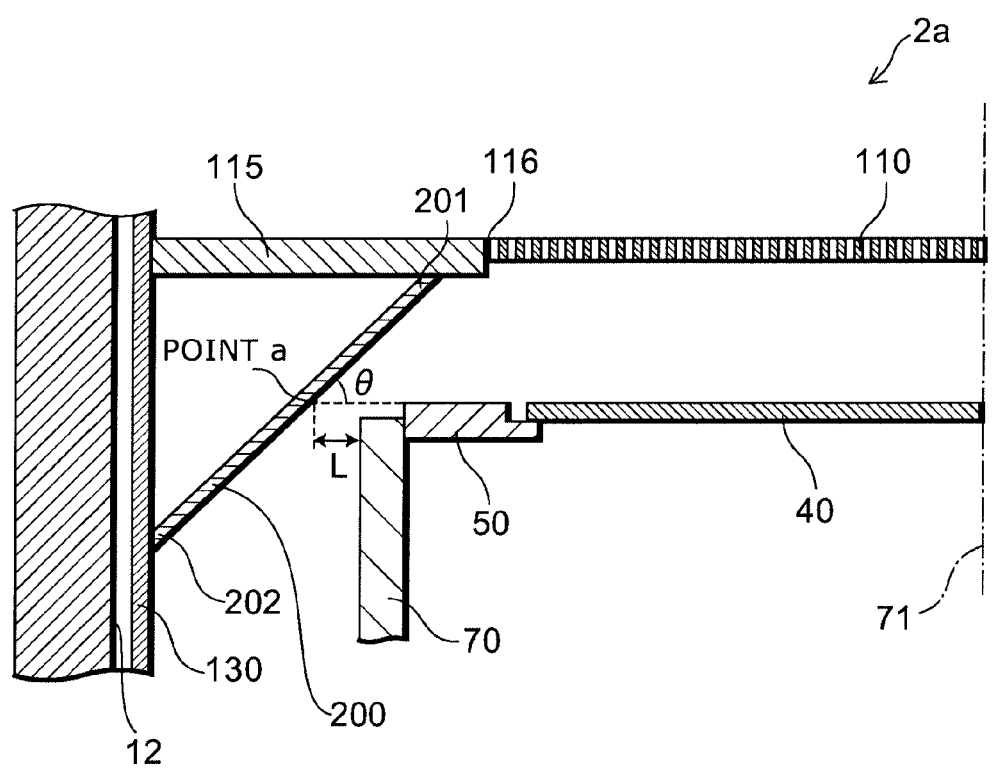
FIG. 8 is a schematic cross-sectional view illustrating a relevant configuration of an epitaxial wafer manufacturing apparatus according to a second embodiment of the invention.

FIG. 8 is a schematic cross-sectional view illustrating a relevant configuration of an epitaxial wafer manufacturing apparatus according to a second embodiment of the invention.

As shown in FIG. 8, the epitaxial wafer manufacturing apparatus 2a according to the second embodiment of the invention includes a flow-regulating wall 200. The flow-regulating wall 200 illustratively has a linear cross-sectional shape. That is, in contrast to the epitaxial wafer manufacturing apparatus 1a illustrated in FIG. 1 where the flow-regulating wall 200 has a curved cross-sectional shape, the epitaxial wafer manufacturing apparatus 2a according to this embodiment includes a flow-regulating wall 200 having a linear cross-sectional shape. The configuration other than the foregoing is the same as that of the epitaxial wafer manufacturing apparatus 1a, and hence the description thereof is omitted.

In the following, a detailed description is given of the characteristics of the epitaxial wafer manufacturing apparatus 2a according to this embodiment for various configurations of the flow-regulating wall 200.

More specifically, as illustrated in FIG. 8, numerical analysis was performed on the backflow rate $V_{in}$ of the reacted gas and the mean age of air with varying the angle θ (flow-regulating wall angle θ) that the flow-regulating wall 200 makes with the upper surface of the wafer holder 50 and the horizontal (perpendicular to the rotation axis of the rotating unit 70) distance L (flow-regulating wall distance L) between the flow-regulating wall 200 and the wafer holder. The flow-regulating wall angle θ was varied by rotation about the point a in the figure at which the extension of the upper surface of the wafer holder 50 intersects the flow-regulating wall 200.

In the following is illustrated a result for the backflow rate $V_{in}$ of the reacted gas and the mean age of air obtained with the flow-regulating wall angle θ kept constant at 45° and the flow-regulating wall distance L varied, and a result for the backflow rate $V_{in}$ of the reacted gas and the mean age of air obtained with the flow-regulating wall distance L kept constant and the flow-regulating wall angle θ varied as 30°, 45°, and 60°.

FIGS. 9 and 10 are schematic diagrams illustrating the characteristics of the epitaxial wafer manufacturing apparatuses of the second embodiment and the first comparative example where the distance and angle of the flow-regulating wall are varied, respectively.

Figure 9A:
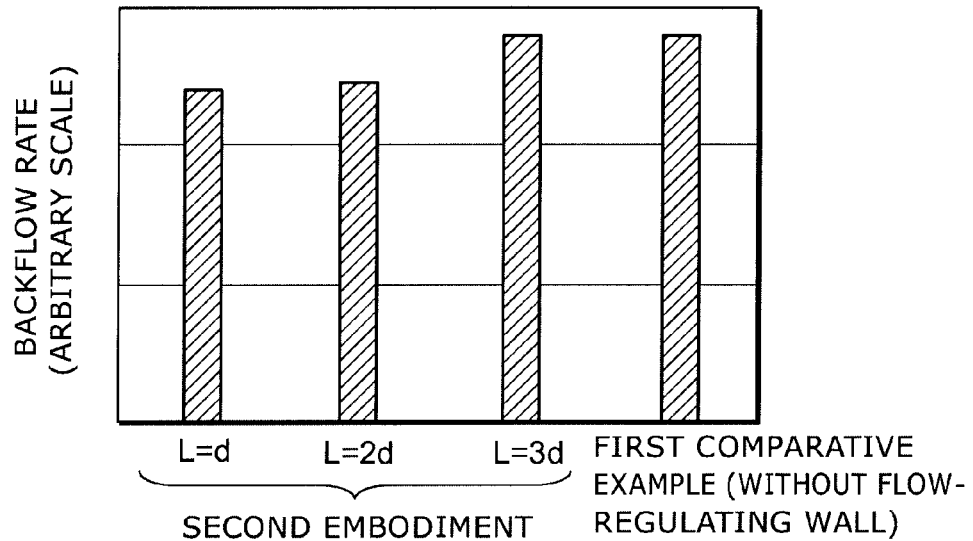
FIGS. 9A and 9B are schematic diagrams illustrating the characteristics of the epitaxial wafer manufacturing apparatuses of the second embodiment and the first comparative example where the distance of the flow-regulating wall is varied, respectively.
Figure 9B:
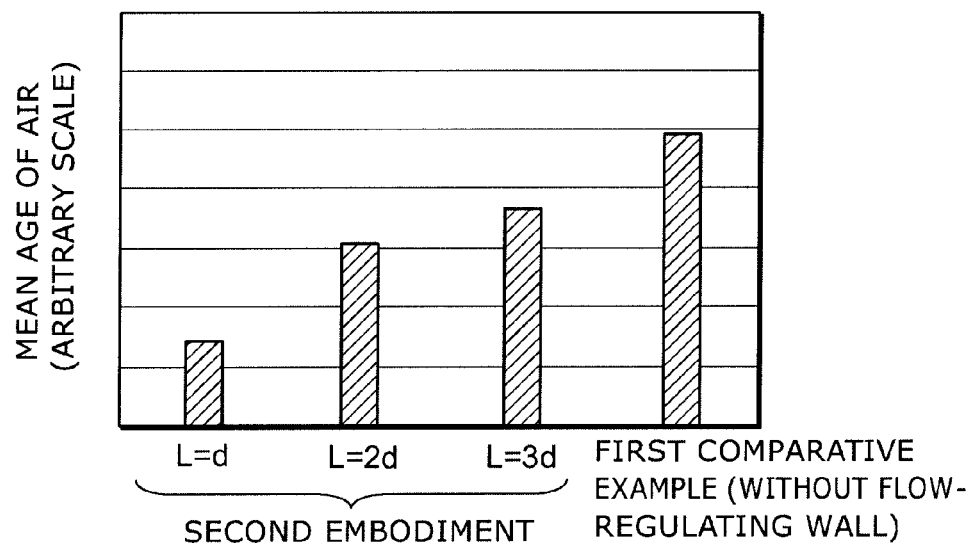
Figure 10A:
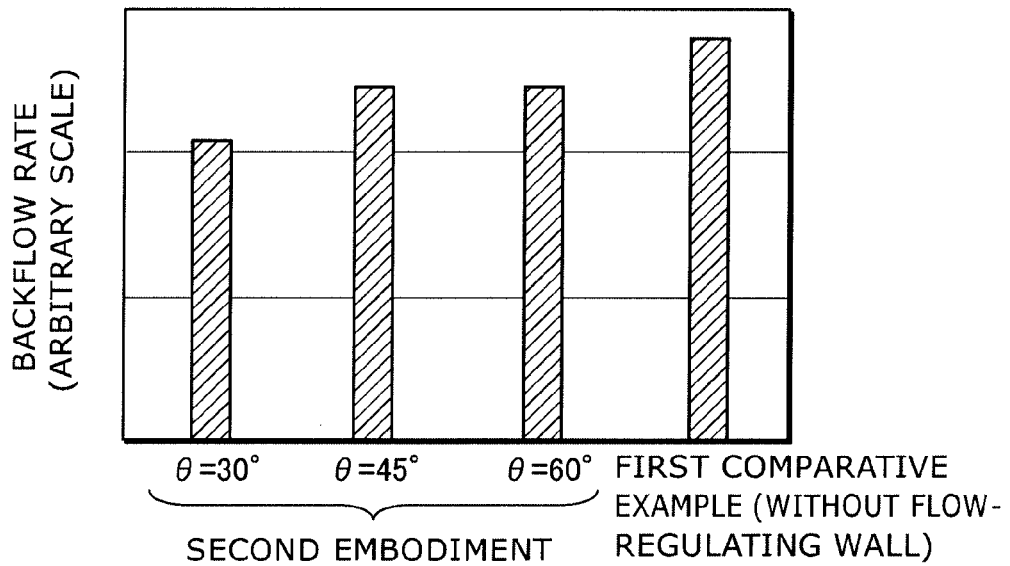
FIGS. 10A and 10B are schematic diagrams illustrating the characteristics of the epitaxial wafer manufacturing apparatuses of the second embodiment and the first comparative example where the angle of the flow-regulating wall is varied, respectively.
Figure 10B:
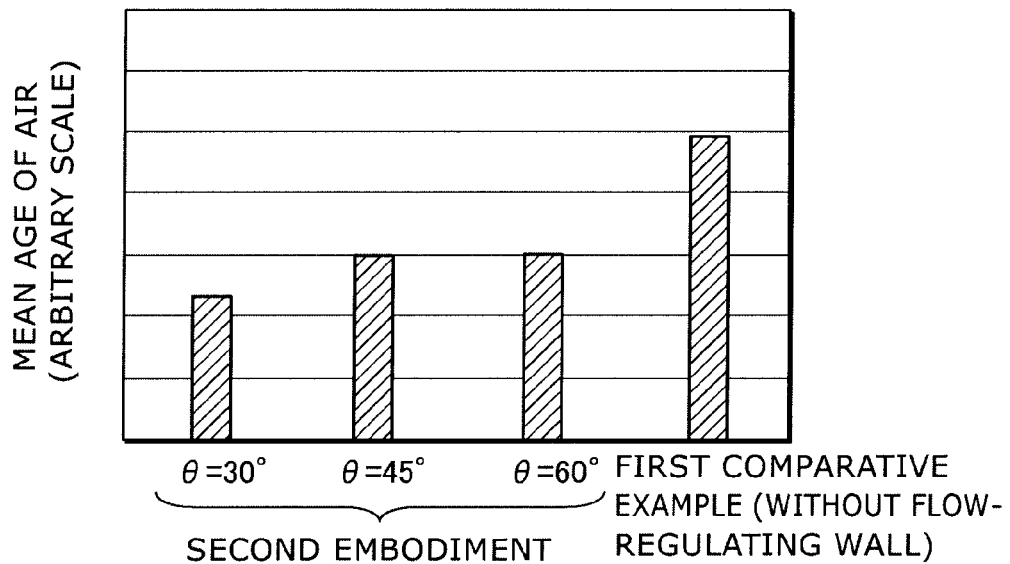

More specifically, FIGS. 9A and 10A illustrate the analysis result for the backflow rate $V_{in}$ of the reacted gas, where the vertical axis represents the backflow rate $V_{in}$ of the reacted gas at the boundary 116 between the adapter 115 and the flow-regulating plate 110 above the wafer holder 50. FIGS. 9B and 10B illustrate the mean age of air, where the vertical axis represents the maximum of the mean age of air on a plane where the boundary 116 between the adapter 115 and the flow-regulating plate 110 is extended from the adapter 115 to the wafer holder 50. These figures also show the result for the epitaxial wafer manufacturing apparatus 9a of the first comparative example.

As illustrated in FIG. 9A, in the epitaxial wafer manufacturing apparatus 2a according to this embodiment, when the flow-regulating wall distance L is large (e.g., L equals to 3d), the backflow rate $V_{in}$ is equivalent to that of the first comparative example. However, when the flow-regulating wall distance L is small (e.g., L equals to d or 2d), the backflow rate $V_{in}$ is particularly smaller than in the comparative example, indicating that backflow is reduced. Here, "d" referred to above is a prescribed length associated with the size of the manufacturing apparatus.

As illustrated in FIG. 9B, in the epitaxial wafer manufacturing apparatus 2a according to this embodiment, for any flow-regulating wall distance L, the mean age of air is smaller than in the first comparative example. Furthermore, with the decrease of the flow-regulating wall distance L, the backflow rate $V_{in}$ decreases.

Thus, with the decrease of the flow-regulating wall distance L, the backflow rate $V_{in}$ decreases, and backflow is reduced, whereas the mean age of air also decreases, and the ventilation efficiency is improved.

On the other hand, as illustrated in FIG. 10A, in the epitaxial wafer manufacturing apparatus 2a according to this embodiment, for any flow-regulating wall angle θ, the backflow rate $V_{in}$ is smaller than in the first comparative example. Furthermore, with the decrease of the flow-regulating wall angle θ, the backflow rate $V_{in}$ decreases. The backflow rate $V_{in}$ is particularly small when θ is 300.

As illustrated in FIG. 10B, in the epitaxial wafer manufacturing apparatus 2a according to this embodiment, for any flow-regulating wall angle θ, the mean age of air is smaller than in the first comparative example. Furthermore, with the decrease of the flow-regulating wall angle θ, the backflow rate $V_{in}$ decreases.

Thus, with the decrease of the flow-regulating wall angle θ, the backflow rate $V_{in}$ decreases, and backflow can be reduced, whereas the mean age of air also decreases, and the ventilation efficiency is improved.

As described above, in the epitaxial wafer manufacturing apparatus 2a according to this embodiment, with the decrease of the flow-regulating wall distance L and the flow-regulating wall angle θ, the backflow rate $V_{in}$ decreases, and backflow can be reduced, whereas the mean age of air also decreases, and the ventilation efficiency is improved.

The backflow rate $V_{in}$ is particularly improved when the flow-regulating wall angle θ is small. More specifically, when the flow-regulating wall angle θ is small, the upper end of the flow-regulating wall 200 is located toward the inner periphery of the wafer holder 50. Here, at the outer periphery of the rotating unit 70, the space above the rotating unit 70 (or the wafer holder 50) has a short vertical length. That is, the vertical gap of space formed by the rotating unit 70 (or the wafer holder 50) and the flow-regulating wall 200 is narrower than in the first comparative example. It is considered that this increases the viscous drag of the reacted gas, decreases the flow rate $V_{out}$ toward the outer periphery, and results in the reduced backflow rate $V_{in}$.

Thus, preferably, the surface (inner surface) of the flow-regulating wall 200 facing the rotating unit 70 is configured to be in close proximity to the outer periphery of the upper portion of the rotating unit 70 so that the vertical length of the space above the rotating unit 70 at the outer periphery of the rotating unit 70 is shorter than the vertical length of the space above the rotating unit 70 at the rotation center of the rotating unit 70.

Furthermore, as described above, with the decrease of the flow-regulating wall distance L, the backflow rate $V_{in}$ and the mean age of air are improved. That is, with the decrease of the flow-regulating wall distance L, the flow-regulating wall 200 comes close to the upper portion of the side surface of the rotating unit 70. This reduces the volume of the space above the rotating unit 70, that is, the space where the reacted gas flows, improves the efficiency of guiding the gas to the gas exhaust port, and decreases the distance between the flow-regulating wall 200 and the rotating unit 70. Thus, the lower space with a high mean age of air (the space between the rotating unit 70 and the liner 130) can be separated from the space above the wafer holder 50. Hence, the backflow rate $V_{in}$ and the mean age of air are improved.

Thus, preferably, the inner surface of the flow-regulating wall 200 is configured to be in close proximity to the side surface of the upper portion of the rotating unit 70 so that the horizontal (outward from the rotation center of the rotating unit 70) distance of the space outside the side surface of the rotating unit 70 at the upper portion of the rotating unit 70 is shorter than the horizontal distance of the space outside the side surface of the rotating unit at the lower portion of the rotating unit 70.

It is noted that, as described above, the configuration of the flow-regulating wall 200 in the epitaxial wafer manufacturing apparatus 1a according to the first embodiment also satisfies the above condition.

Third Embodiment

Figure 11:
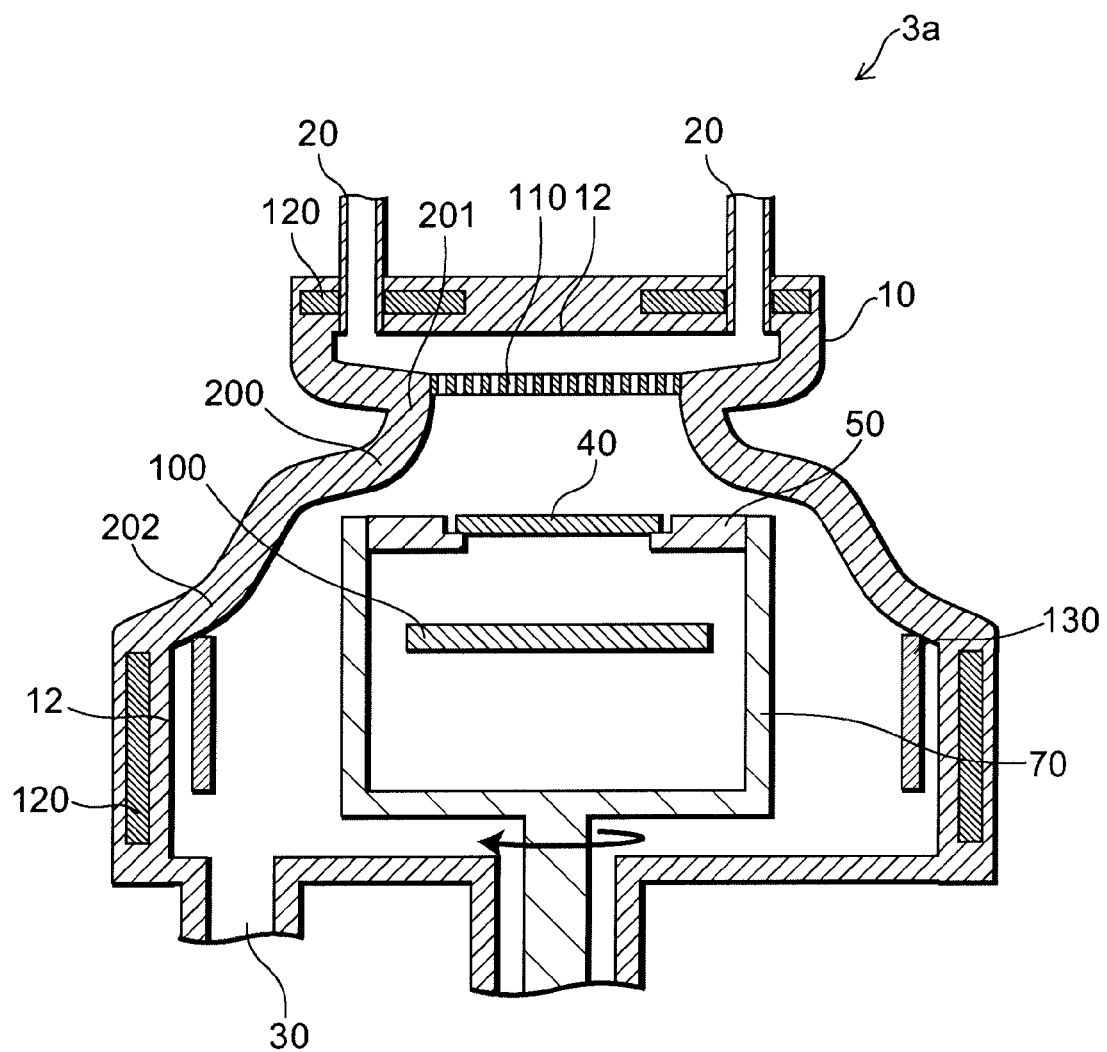
FIG. 11 is a schematic cross-sectional view illustrating the configuration of an epitaxial wafer manufacturing apparatus according to a third embodiment of the invention.

FIG. 11 is a schematic cross-sectional view illustrating the configuration of an epitaxial wafer manufacturing apparatus according to a third embodiment of the invention.

As shown in FIG. 11, the epitaxial wafer manufacturing apparatus 3a according to the third embodiment of the invention is an example where the inner wall 12 of the chamber 10 itself serves as a flow-regulating wall 200.

More specifically, the inner wall of the chamber 10 includes an annular flow-regulating wall 200, which surrounds the rotating unit 70 and the wafer holder 50 with a spacing therefrom and expands downward. The upper end of the flow-regulating wall 200 is located above the wafer holder 50 and has a smaller inner diameter than the outer periphery of the wafer holder 50. The lower end of the flow-regulating wall 200 is located below the upper surface of the rotating unit 70 and has a larger inner diameter than the outer periphery of the rotating unit 70.

In other words, the inner surface of the chamber 10 provides a flow-regulating wall 200, which has an upper end located above the wafer holder 50 and inside the outer periphery of the wafer holder 50, and a lower end located below the upper surface of the rotating unit 70 and outside the outer periphery of the rotating unit 70. The flow-regulating wall 200 regulates the reacted gas resulting from reaction of the reaction gas and causes it to flow out toward the gas exhaust port 30.

That is, in the epitaxial wafer manufacturing apparatus 3a, the inner wall 12 of the chamber 10 is shaped like the inner side surface of the flow-regulating wall 200 illustrated in FIG. 1. In this case, the flow-regulating wall 200 has a curved cross-sectional shape.

Also in this configuration, the backflow rate onto the wafer and the mean age of air can be significantly reduced. Thus, this configuration can provide an epitaxial wafer manufacturing apparatus with high productivity by improving film formation rate, gas utilization efficiency, and gas replacement efficiency.

Furthermore, because the inner wall 12 of the chamber 10 itself serves as a flow-regulating wall 200, the number of components can be decreased. This provides various advantages such as easy maintenance and cost reduction of the apparatus.

Figure 12:
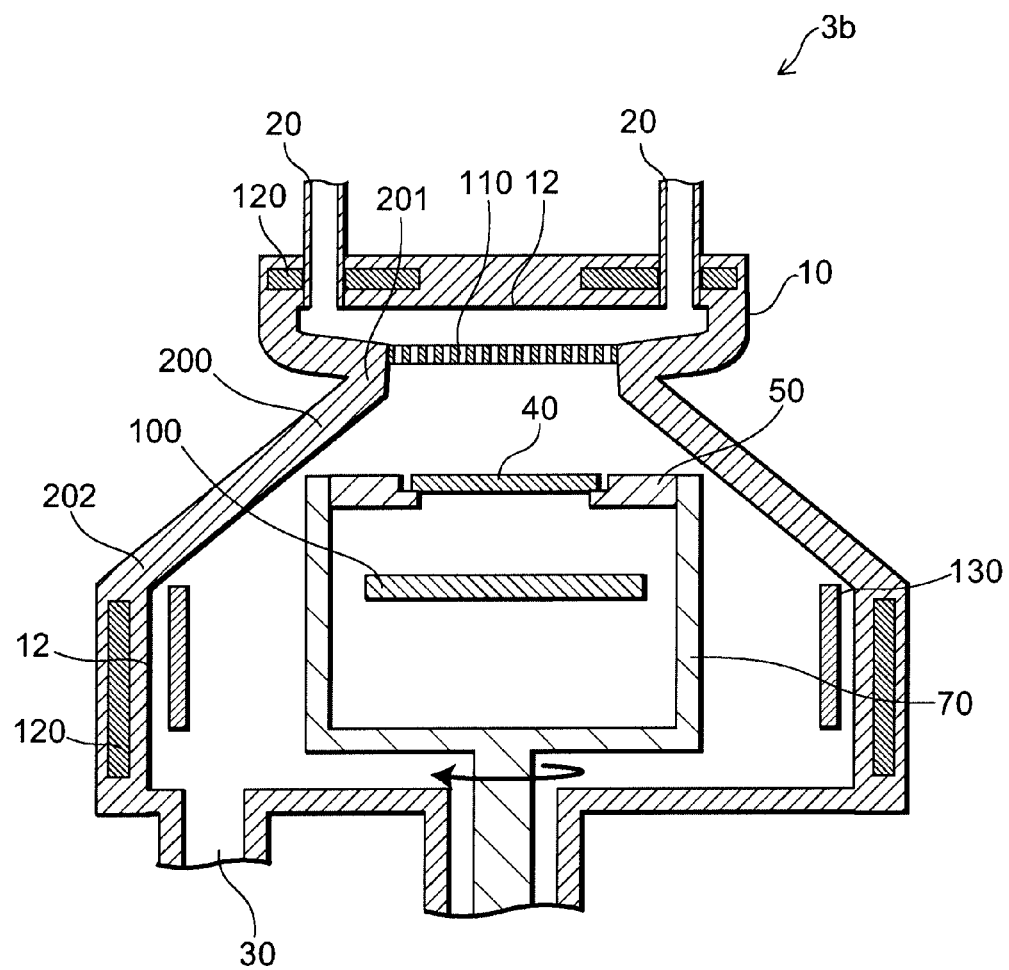
FIG. 12 is a schematic cross-sectional view illustrating the configuration of an another epitaxial wafer manufacturing apparatus according to the third embodiment of the invention.

FIG. 12 is a schematic cross-sectional view illustrating the configuration of another epitaxial wafer manufacturing apparatus according to the third embodiment of the invention.

As shown in FIG. 12, the another epitaxial wafer manufacturing apparatus 3b according to the third embodiment of the invention is another example where the inner wall 12 of the chamber 10 itself serves as a flow-regulating wall 200. More specifically, in the manufacturing apparatus 3b, the inner wall 12 of the chamber 10 has a linear cross-sectional shape.

Also in this configuration, the backflow rate onto the wafer and the mean age of air can be significantly reduced. Thus, this configuration can provide an epitaxial wafer manufacturing apparatus with high productivity by improving film formation rate, gas utilization efficiency, and gas replacement efficiency.

Furthermore, because the inner wall 12 of the chamber 10 itself serves as a flow-regulating wall 200, the number of components can be decreased. This provides various advantages such as easy maintenance and cost reduction of the apparatus.

In FIGS. 11 and 12, a cooling pipe can be provided also inside the wall of the chamber 10 which provides a flow-regulating wall 200. Furthermore, a protective layer illustratively made of quartz or SiC, which is less susceptible to contamination by the reaction gas, can be provided on the inner surface of the chamber 10 which provides a flow-regulating wall 200.

Fourth Embodiment

Figure 13:
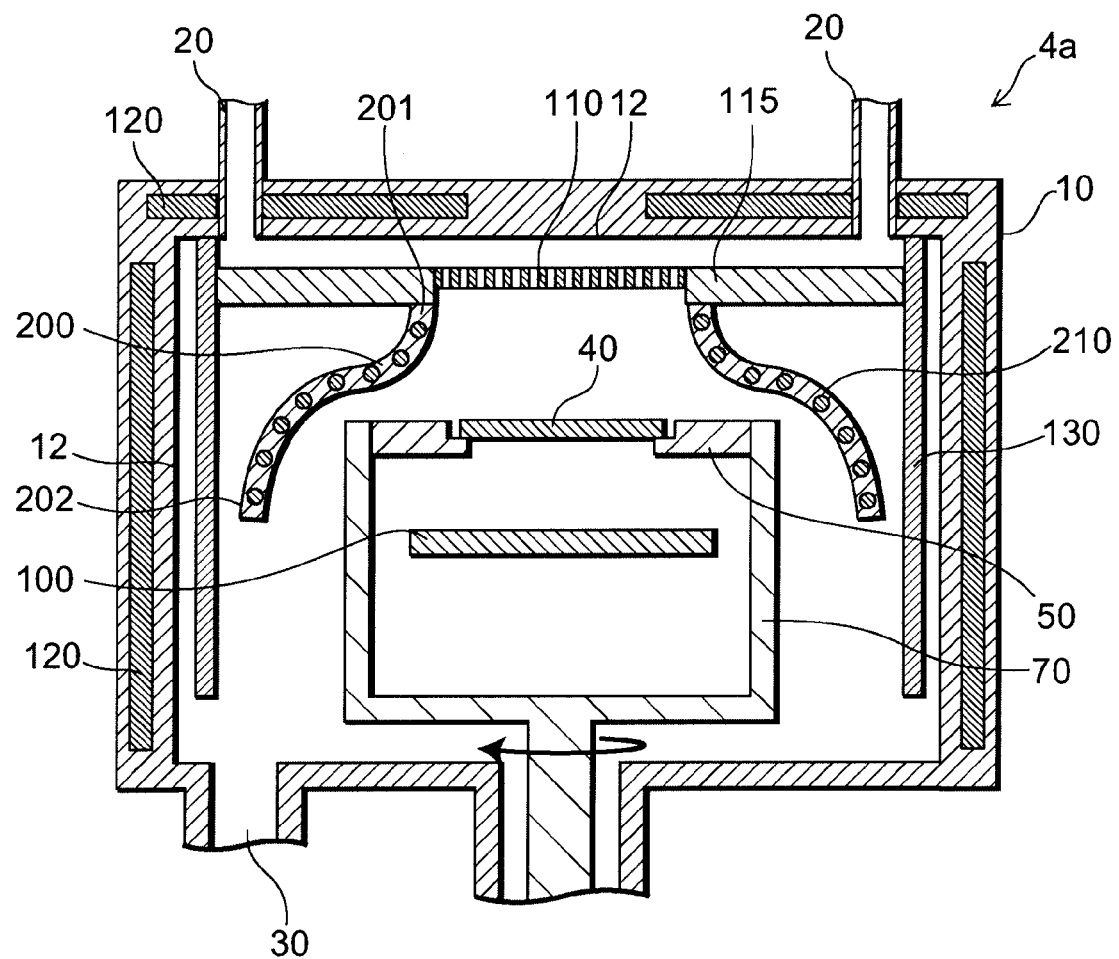
FIG. 13 is a schematic cross-sectional view illustrating the configuration of an epitaxial wafer manufacturing apparatus according to a fourth embodiment of the invention.

FIG. 13 is a schematic cross-sectional view illustrating the configuration of an epitaxial wafer manufacturing apparatus according to a fourth embodiment of the invention.

As shown in FIG. 13, the epitaxial wafer manufacturing apparatus 4a according to the fourth embodiment is the same as the epitaxial wafer manufacturing apparatus 1a illustrated in FIG. 1 except that the flow-regulating wall 200 includes a flow-regulating wall heater 210 (first heater). The configuration other than the foregoing is the same as that of the epitaxial wafer manufacturing apparatus 1a, and hence the description thereof is omitted.

The flow-regulating wall heater 210 heats at least part of the wafer holder 50. In the epitaxial wafer manufacturing apparatus 4a, because the flow-regulating wall 200 includes the flow-regulating wall heater 210, the outer periphery of the wafer holder 50 can be heated by the flow-regulating wall heater 210. Thus, in addition to improvement in film growth rate, gas utilization efficiency, and gas replacement efficiency, this configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained.

More specifically, in producing a single crystal film on the wafer 40, the temperature of the wafer is increased to a high temperature, such as approximately 1100° C., by radiant heat from the internal heater 100. At this time, the temperature of the wafer holder 50 is also increased.

At this time, typically, the flow velocity of the reaction gas is faster at the outer periphery of the wafer holder 50, and hence the outer periphery of the wafer holder 50 tends to be cooled by the reaction gas. Furthermore, for example, the outer wall of the chamber 10 is cooled by cooling water, and its temperature is decreased. Then, the outer periphery of the wafer holder 50 is cooled by radiation to this outer wall. Thus, the temperature of the outer periphery of the wafer holder 50 tends to be lower than its inside.

Hence, in conventional epitaxial wafer manufacturing apparatuses, a large stress is likely to occur in the wafer holder 50 due to this temperature difference between the outer periphery and the inside. Furthermore, the same situation also occurs in the case where a susceptor for holding the backside of the wafer 40 is used for the wafer holder 50. Hence, a stress due to temperature difference occurs in the susceptor and produces a slight strain in the susceptor. This causes nonuniformity in the contact between the backside of the wafer 40 and the susceptor, and results in nonuniformity in the temperature of the wafer 40, which makes it difficult to obtain a uniform epitaxial film.

In contrast, in the epitaxial wafer manufacturing apparatus 4a according to this embodiment, the outer periphery of the wafer holder 50 can be heated by the flow-regulating wall heater 210. This serves to prevent temperature decrease in the outer periphery of the wafer holder 50, and consequently relax stress in the wafer holder 50. Furthermore, because the outer periphery of the wafer 40 can be heated by both the internal heater 100 and the flow-regulating wall heater 210, the outer periphery of the wafer 40 can be locally heated. Hence, the temperature distribution in the wafer 40 is made uniform, and a uniform epitaxial film is obtained.

It is noted that the raw material gas may be adhered to the flow-regulating wall 200. Here, when this adherent is removed by introducing a gas such as HCl, the flow-regulating wall 200 can be heated by the flow-regulating wall heater 210, which facilitates the removal operation. Thus, the configuration of this embodiment is superior also in terms of the efficiency of cleaning the apparatus.

FIG. 14 is a schematic cross-sectional view illustrating the configuration of variations of the epitaxial wafer manufacturing apparatus according to the fourth embodiment of the invention.

Figure 14A:
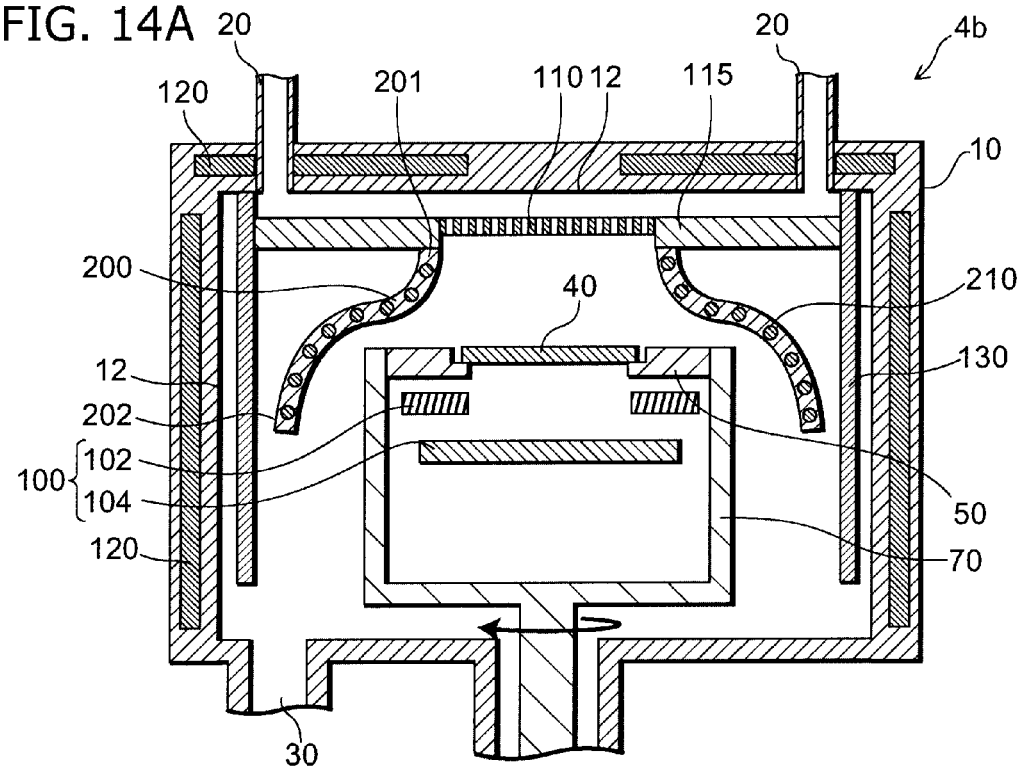
FIGS. 14A and 14B are schematic cross-sectional views illustrating the configuration of variations of the epitaxial wafer manufacturing apparatus according to the fourth embodiment of the invention.

As shown in FIG. 14A, the epitaxial wafer manufacturing apparatus 4b of a variation according to this embodiment is the same as the epitaxial wafer manufacturing apparatus 4a illustrated in FIG. 13 except that the internal heater 100 includes an outer heater 102 and an inner heater 104. The configuration other than the foregoing is the same as that of the epitaxial wafer manufacturing apparatus 4a, and hence the description thereof is omitted.

The inner heater 104 illustratively has a disk shape, and the outer heater 102 is provided at the outer periphery of the inner heater 104 and has an annular shape. In this example, the outer heater 102 is located nearer to the wafer holder 50 than the inner heater 104. Epitaxial film formation is performed while heating the wafer 40 by the inner heater 104 and the outer heater 102.

Here, to achieve temperature uniformity in the wafer 40, typically, the outer heater 102 has a very high temperature. This decreases the lifetime of the outer heater 102, and results in decreased productivity.

In contrast, in the epitaxial wafer manufacturing apparatus 4b according to this embodiment, the outer periphery of the wafer 40 can be heated by the flow-regulating wall heater 210, and consequently, the temperature of the outer heater 102 can be made lower than conventional. Thus, the lifetime of the outer heater 102 is increased, and the productivity is improved. Furthermore, the outer periphery of the wafer 40 can be locally heated by the flow-regulating wall heater 210, and the temperature distribution in the wafer 40 is made uniform. Hence, a uniform epitaxial film is obtained.

Figure 14B:
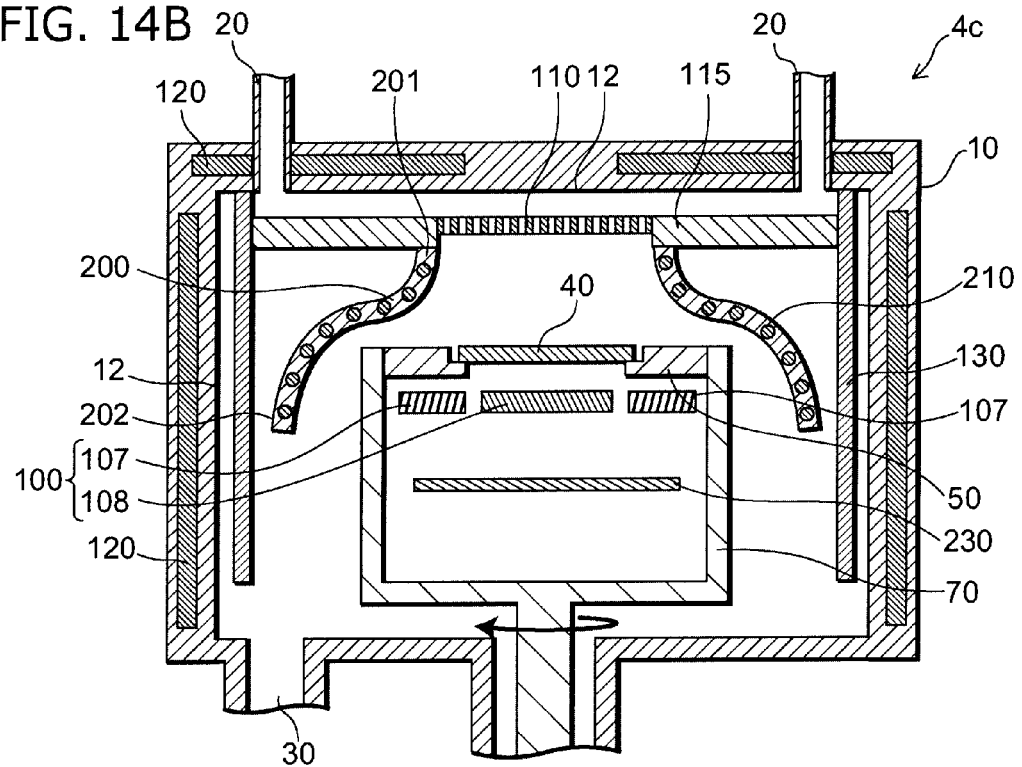

As shown in FIG. 14B, the epitaxial wafer manufacturing apparatus 4c of a variation according to this embodiment is the same as the epitaxial wafer manufacturing apparatus 4b illustrated in FIG. 14A except that the internal heater 100 includes an inner heater 108 and an outer heater 107 which are substantially coplanar with each other. The configuration other than the foregoing is the same as that of the epitaxial wafer manufacturing apparatus 4b, and hence the description thereof is omitted.

Also in this case, the outer periphery of the wafer 40 can be heated by the flow-regulating wall heater 210, and the temperature of the outer heater 107 can be made lower than conventional. Thus, the lifetime of the outer heater 107 is increased, and the productivity is improved. Furthermore, the temperature distribution in the wafer 40 is made uniform, and a uniform epitaxial film is obtained.

Figure 15:
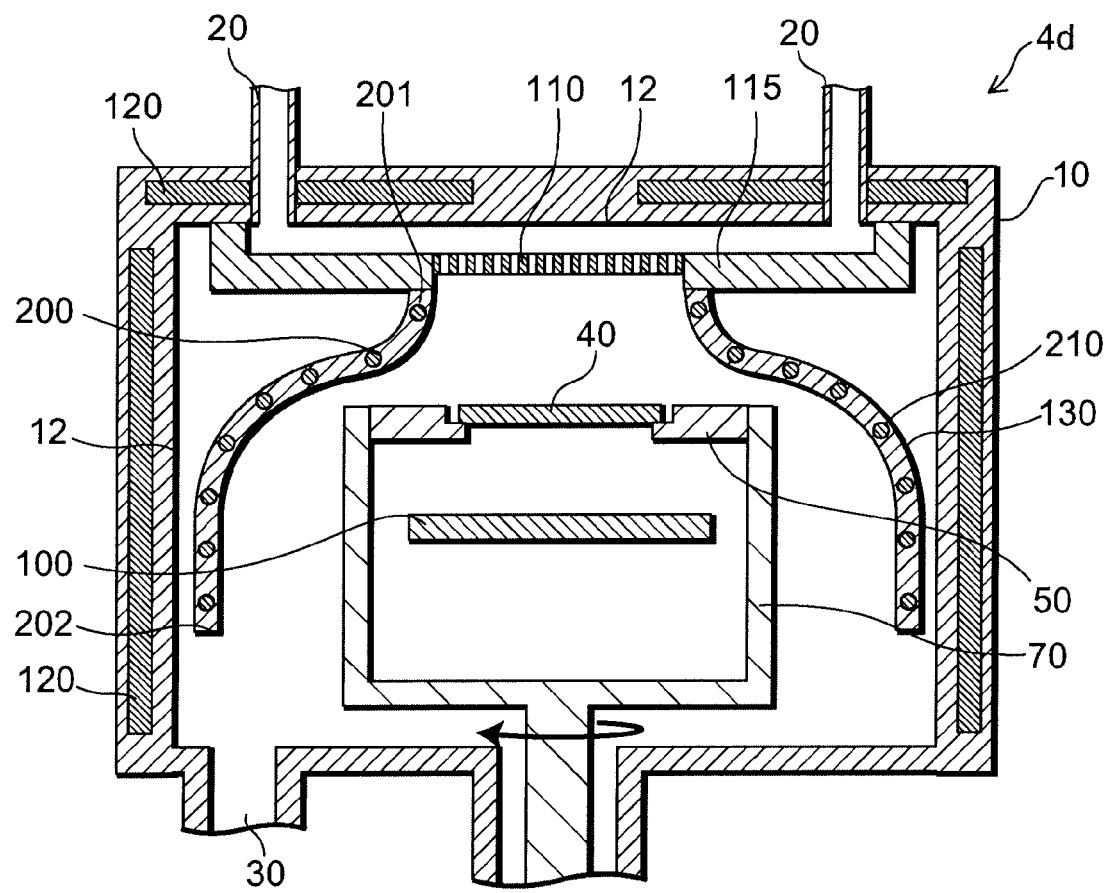
FIG. 15 is a schematic cross-sectional view illustrating the configuration of a variation of the epitaxial wafer manufacturing apparatus according to the fourth embodiment of the invention.

FIG. 15 is a schematic cross-sectional view illustrating the configuration of a variation of the epitaxial wafer manufacturing apparatus according to the fourth embodiment of the invention.

As shown in FIG. 15, the epitaxial wafer manufacturing apparatus 4d of the variation according to this embodiment is the same as the epitaxial wafer manufacturing apparatus 1b illustrated in FIG. 6 except that the flow-regulating wall 200 includes a flow-regulating wall heater 210. That is, the flow-regulating wall 200 doubles as a liner, and further includes a flow-regulating wall heater 210. The configuration other than the foregoing is the same as that of the epitaxial wafer manufacturing apparatus 1b, and hence the description thereof is omitted.

Also in this case, in addition to improvement in film growth rate, gas utilization efficiency, and gas replacement efficiency, this configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained. Moreover, because the flow-regulating wall 200 doubles as a liner, the number of components is decreased. This provides various advantages such as easy maintenance and cost reduction of the apparatus.

Figure 16:
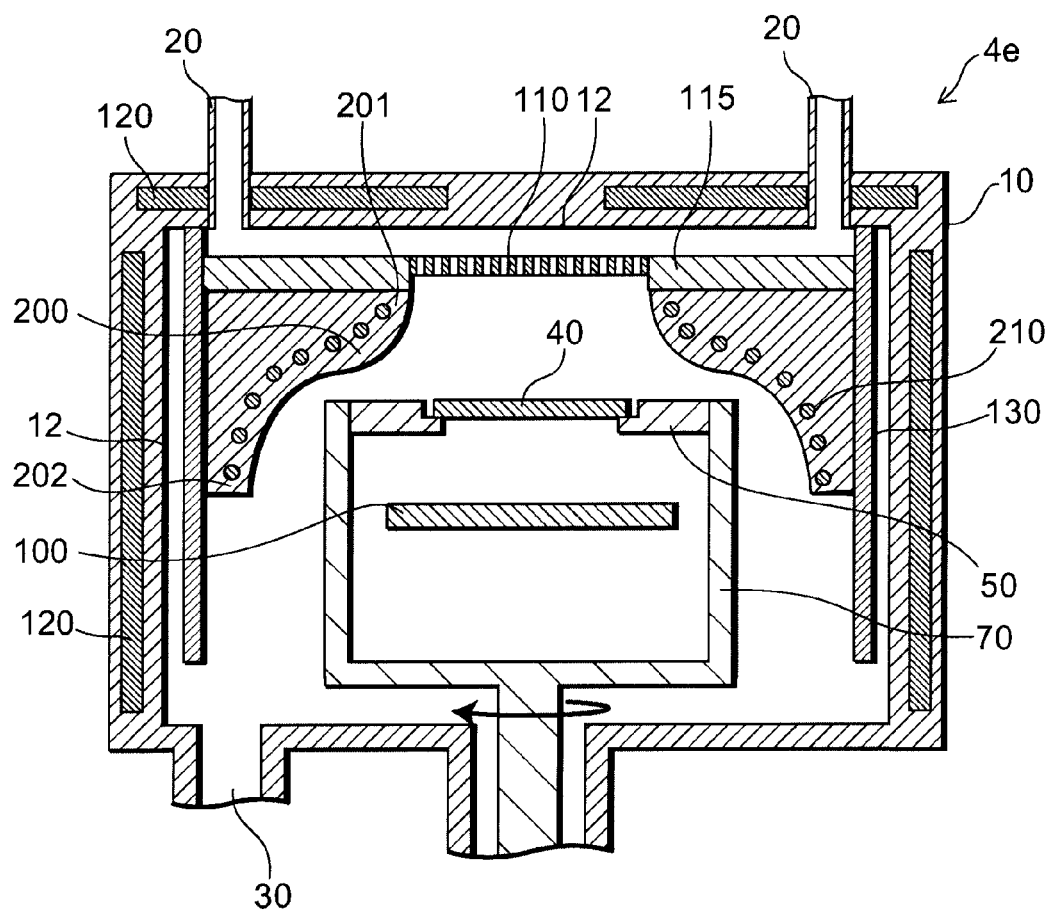
FIG. 16 is a schematic cross-sectional view illustrating the configuration of a variation of the epitaxial wafer manufacturing apparatus according to the fourth embodiment of the invention.

FIG. 16 is a schematic cross-sectional view illustrating the configuration of a variation of the epitaxial wafer manufacturing apparatus according to the fourth embodiment of the invention.

As shown in FIG. 16, the epitaxial wafer manufacturing apparatus 4e of the variation according to this embodiment is the same as the epitaxial wafer manufacturing apparatus 1c illustrated in FIG. 7 except that the flow-regulating wall 200 includes a flow-regulating wall heater 210. The configuration other than the foregoing is the same as that of the epitaxial wafer manufacturing apparatus 1c, and hence the description thereof is omitted.

Also in this case, in addition to improvement in film growth rate, gas utilization efficiency, and gas replacement efficiency, this configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained.

In the above epitaxial wafer manufacturing apparatuses 4d and 4e, the internal heater 100 may include an outer heater 102 and an inner heater 104 which are located at different positions with respect to the wafer holder 50, or an outer heater 107 and an inner heater 108 which are substantially coplanar with each other with respect to the wafer holder 50.

In the above epitaxial wafer manufacturing apparatuses 4a-4e, a susceptor may be used for the wafer holder 50. In this case, stress due to temperature difference is reduced in the susceptor, and strain in the susceptor is reduced. This leads to uniformity in the contact between the backside of the wafer 40 and the susceptor. Consequently, the temperature of the wafer 40 is made uniform, and a uniform epitaxial film is obtained.

In the example structures of the above epitaxial wafer manufacturing apparatuses 4a-4e, the flow-regulating wall heater 210 is illustratively embedded inside the flow-regulating wall 200. However, the invention is not limited thereto. That is, the flow-regulating wall 200 only needs to have a flow-regulating wall heater 210. The flow-regulating wall heater 210 may be provided, in contact at least in part, or without contact, on the outer surface of the flow-regulating wall 200 (the surface on the opposite side of the rotating unit 70, that is, in these examples, the surface facing the inner wall 12 of the chamber 10).

Fifth Embodiment

FIG. 17 is a schematic cross-sectional view illustrating the configuration of epitaxial wafer manufacturing apparatuses according to a fifth embodiment of the invention.

Figure 17A:
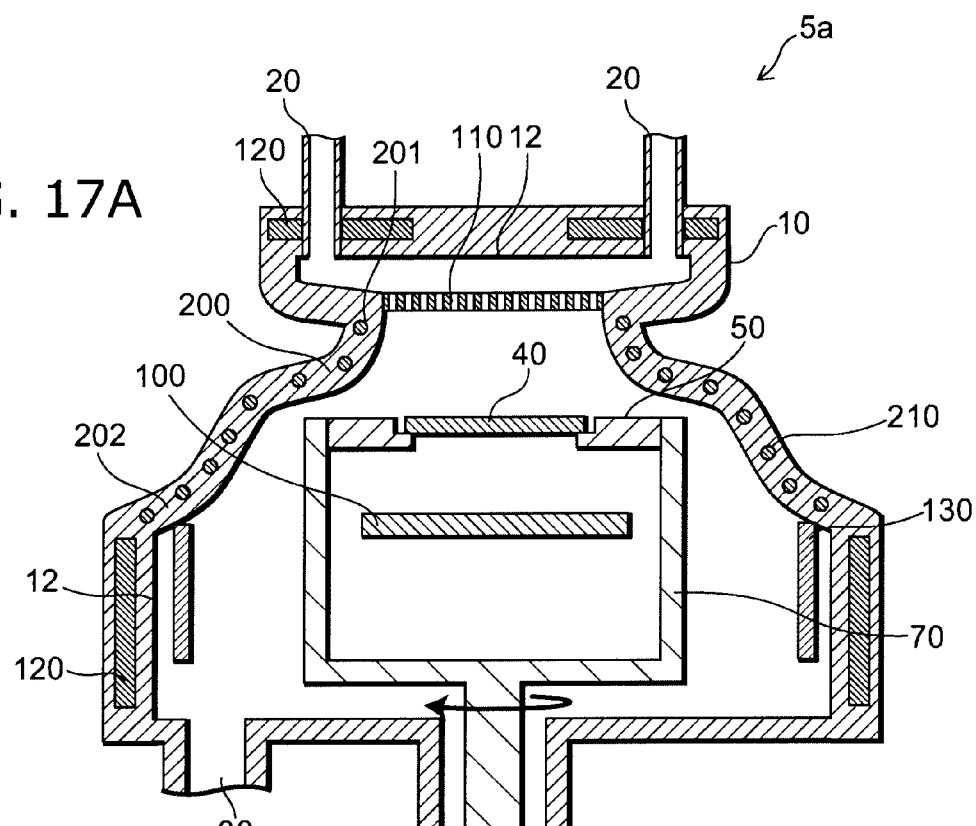
FIGS. 17A and 17B are schematic cross-sectional views illustrating the configuration of epitaxial wafer manufacturing apparatuses according to a fifth embodiment of the invention.
Figure 17B:
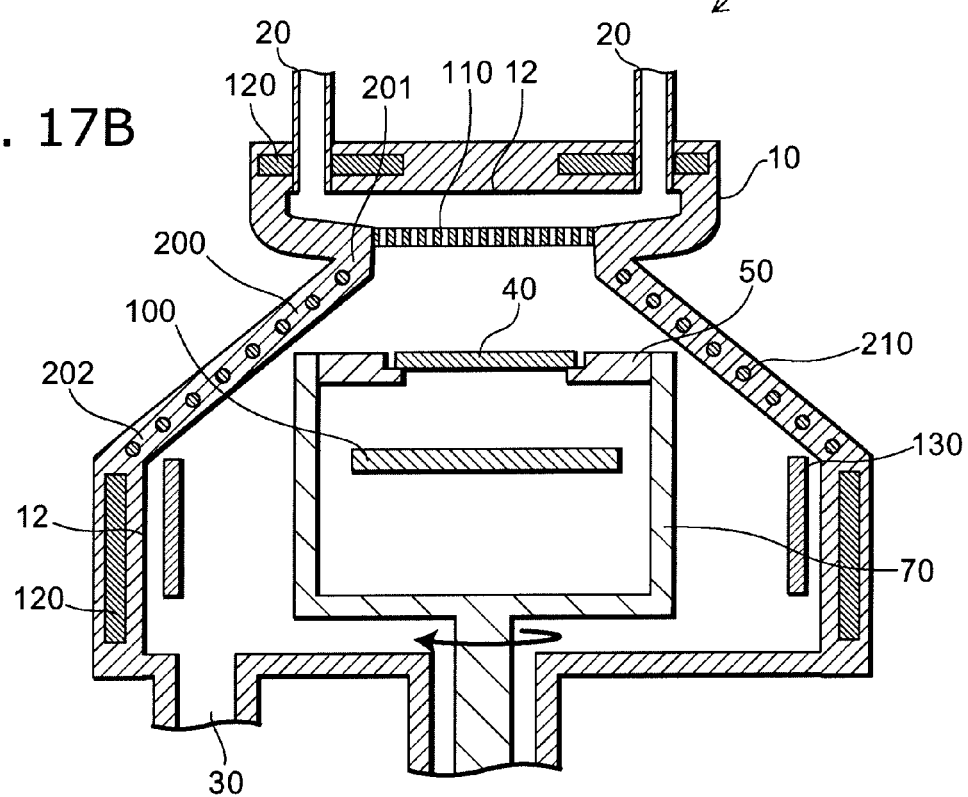

As shown in FIGS. 17A and 17B, the epitaxial wafer manufacturing apparatuses 5a and 5b according to this embodiment are the same as the epitaxial wafer manufacturing apparatuses 3a and 3b illustrated in FIGS. 11 and 12, respectively, except that the flow-regulating wall 200 formed in part of the inner wall 12 includes a flow-regulating wall heater 210. The configuration other than the foregoing is the same as that of the epitaxial wafer manufacturing apparatuses 3a and 3b, and hence the description thereof is omitted.

More specifically, in the epitaxial wafer manufacturing apparatuses 5a and 5b, the inner wall 12 of the chamber 10 includes an annular flow-regulating wall 200, which surrounds the rotating unit 70 and the wafer holder 50 with a spacing therefrom and expands downward. Furthermore, the flow-regulating wall 200 includes a flow-regulating wall heater 210.

Also in this case, in addition to improvement in film growth rate, gas utilization efficiency, and gas replacement efficiency, this configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained.

Also in this case, it is noted that the raw material gas may be adhered to the flow-regulating wall 200, which is the inner wall 12 of the chamber 10. Here, when this adherent is removed by introducing a gas such as HCl, the flow-regulating wall 200 can be heated by the flow-regulating wall heater 210, which facilitates the removal operation. Thus, the configuration of this embodiment is superior also in terms of the efficiency of cleaning the apparatus.

In the above epitaxial wafer manufacturing apparatuses 5a and 5b, the internal heater 100 may include an outer heater 102 and an inner heater 104 which are located at different positions with respect to the wafer holder 50, or an outer heater 107 and an inner heater 108 which are substantially coplanar with each other with respect to the wafer holder 50.

In the above epitaxial wafer manufacturing apparatuses 5a and 5b, a susceptor may be used for the wafer holder 50. In this case, stress due to temperature difference is reduced in the susceptor, and strain in the susceptor is reduced. This leads to uniformity in the contact between the backside of the wafer 40 and the susceptor. Consequently, the temperature of the wafer 40 is made uniform, and a uniform epitaxial film is obtained.

In the example structures of the above epitaxial wafer manufacturing apparatuses 5a and 5b, the flow-regulating wall heater 210 is illustratively embedded inside the flow-regulating wall 200. However, the invention is not limited thereto. That is, the flow-regulating wall 200 only needs to have a flow-regulating wall heater 210. The flow-regulating wall heater 210 may illustratively be provided, in contact at least in part, or without contact, on the outer surface of the flow-regulating wall 200 (the surface on the opposite side of the rotating unit 70, that is, in these examples, the outer surface of the chamber 10).

Sixth Embodiment

Figure 18A:
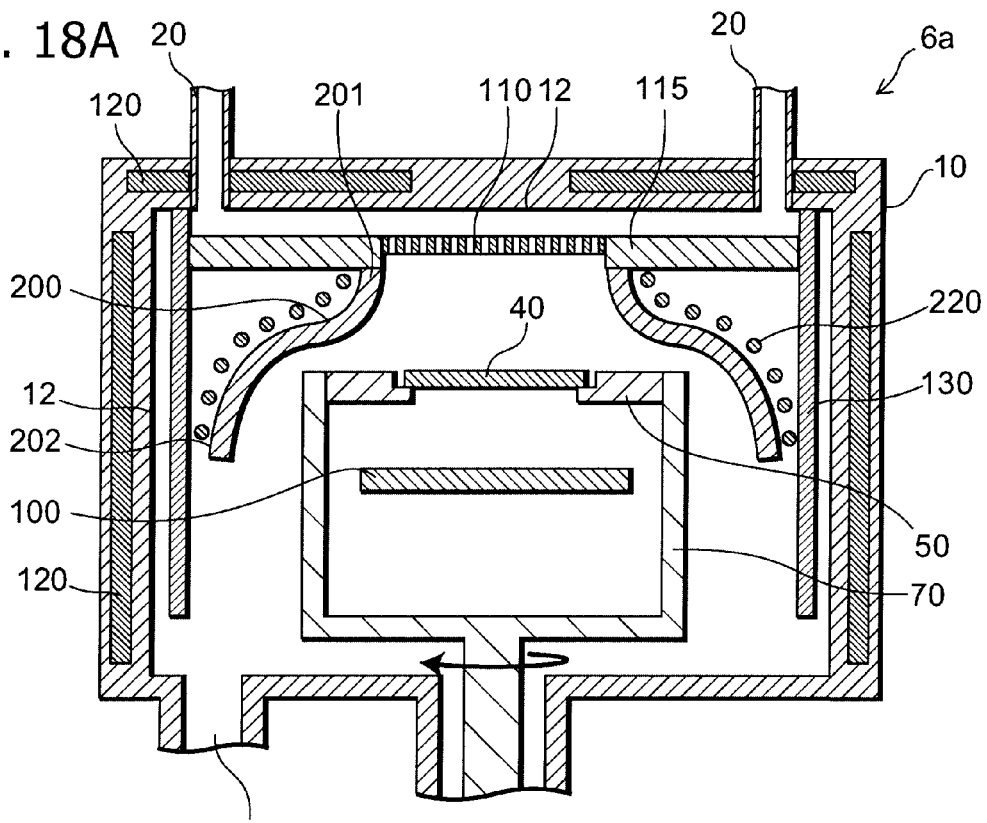
FIGS. 18A and 18B are schematic cross-sectional views illustrating the configuration of epitaxial wafer manufacturing apparatuses according to a sixth embodiment of the invention.
Figure 18B:
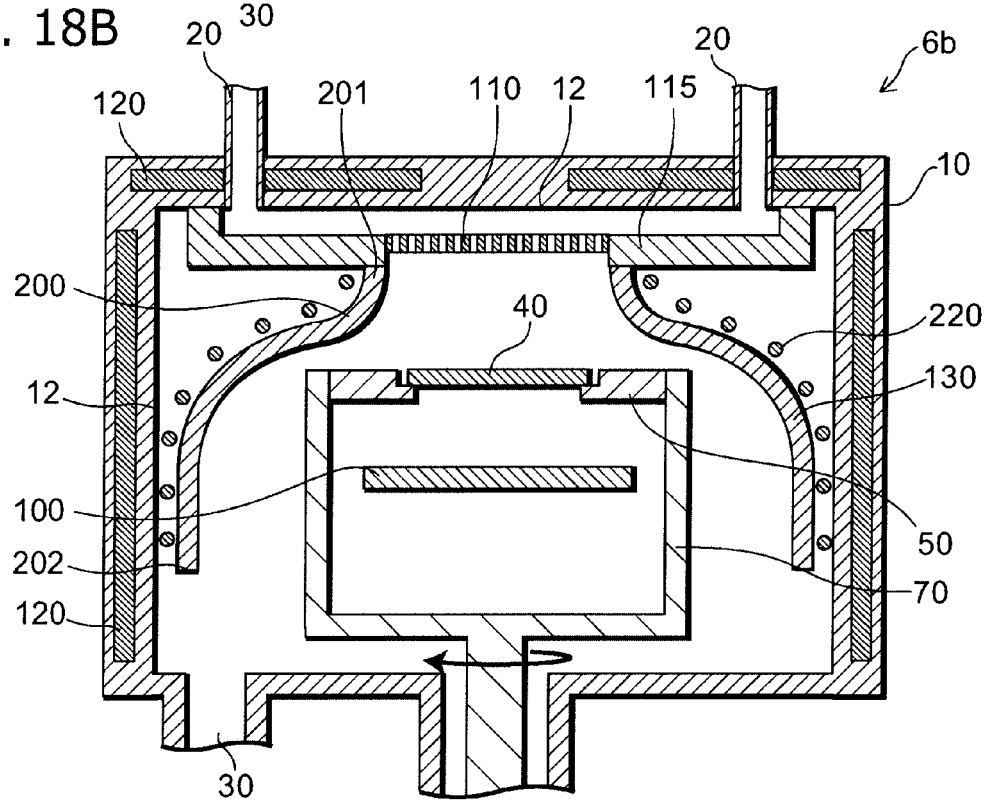

FIG. 18 is a schematic cross-sectional view illustrating the configuration of the epitaxial wafer manufacturing apparatuses according to the sixth embodiment of the invention.

As shown in FIG. 18, the epitaxial wafer manufacturing apparatuses 6a and 6b according to this embodiment are the same as the epitaxial wafer manufacturing apparatuses 1a and 1b illustrated in FIGS. 1 and 6 except that an additional heater 220 is further provided between the flow-regulating wall 200 and the chamber 10. That is, the additional heater 220 is provided on the side of the flow-regulating wall 200 opposite to the rotating unit 70.

The additional heater 220 is provided as a member separate from the flow-regulating wall 200. The additional heater 220 heats at least part of the wafer holder 50. Specifically, the additional heater 220 heats the flow-regulating wall 200, and consequently, the outer periphery of the wafer holder 50 can be heated by the additional heater 220 with radiant heat from the flow-regulating wall 200. Thus, in addition to improvement in film growth rate, gas utilization efficiency, and gas replacement efficiency, this configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained.

Thus, the additional heater 220 can be provided on at least one of the rotating unit 70 side of the flow-regulating wall 200 and the side of the flow-regulating wall 200 opposite to the rotating unit 70. It is noted that this additional heater 220 can be provided in any of the epitaxial wafer manufacturing apparatuses according to the above embodiments of the invention.

Seventh Embodiment

Figure 19:
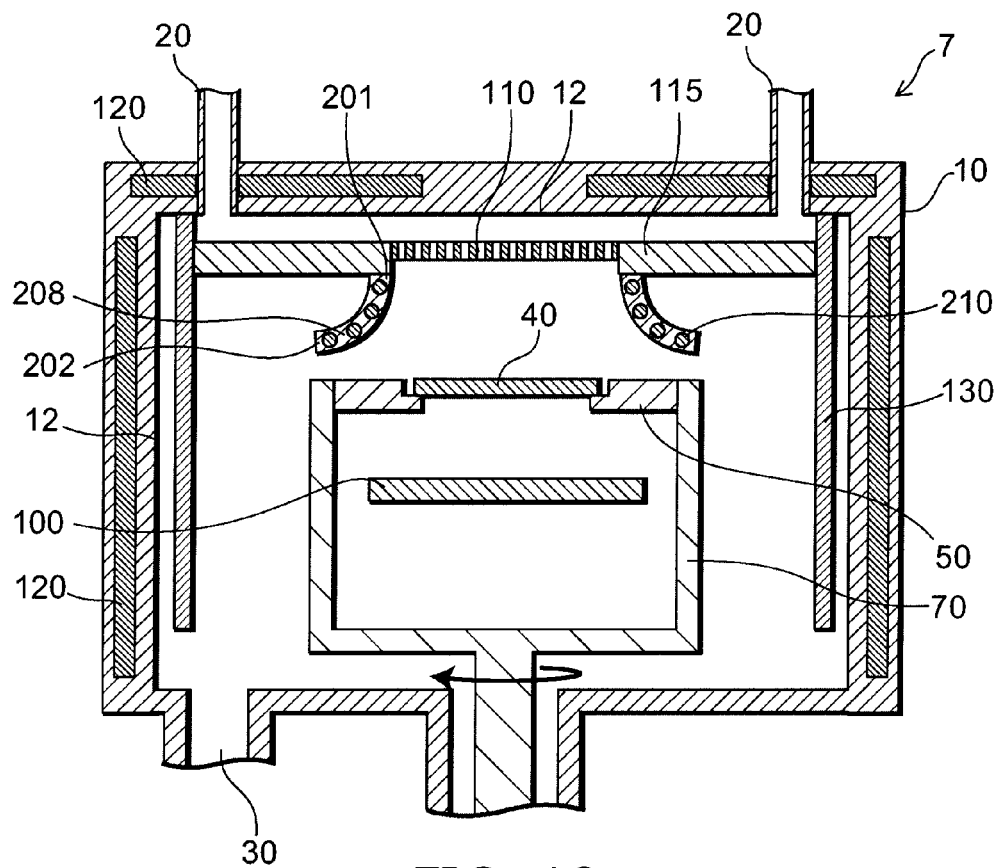
FIG. 19 is a schematic cross-sectional view illustrating the configuration of an epitaxial wafer manufacturing apparatus according to a seventh embodiment of the invention.

FIG. 19 is a schematic cross-sectional view illustrating the configuration of an epitaxial wafer manufacturing apparatus according to a seventh embodiment of the invention.

As shown in FIG. 19, the epitaxial wafer manufacturing apparatus 7 according to this embodiment is the same as the epitaxial wafer manufacturing apparatus 9b illustrated in FIG. 3 except that the flow-regulating wall 208 includes a flow-regulating wall heater 210.

More specifically, the epitaxial wafer manufacturing apparatus 7 includes a chamber 10, a gas introduction port 20 provided in the chamber 10 for introducing a reaction gas into the chamber 10, a gas exhaust port 30 provided in the chamber 10 for exhausting the reaction gas from inside the chamber 10, a rotating unit 70 provided inside the chamber 10, a wafer holder 50 provided in an upper portion of the rotating unit 70 for holding a wafer 40, and an annular flow-regulating wall 208, which is spaced from the rotating unit 70 and the wafer holder 50, surrounds the upper portion thereof, and expands downward. The upper end of the flow-regulating wall 208 is located above the wafer holder 50 and has a smaller inner diameter than the outer periphery of the wafer holder 50. The flow-regulating wall 208 includes a flow-regulating wall heater 210 (first heater).

The flow-regulating wall heater 210 heats at least part of the wafer holder 50. That is, the outer periphery of the wafer holder 50 can be heated by the flow-regulating wall heater 210. This configuration can reduce temperature difference in the wafer holder 50, thereby relaxing stress to reduce strain and the risk of destruction in the wafer holder 50. Furthermore, temperature uniformity in the wafer 40 is enhanced, and a uniform epitaxial film is obtained.

Furthermore, because the outer periphery of the wafer 40 can be heated by both the internal heater 100 and the flow-regulating wall heater 210, the outer periphery of the wafer 40 can be locally heated. Hence, the temperature distribution in the wafer 40 is made uniform, and a uniform epitaxial film is obtained.

Thus, in the case where the wafer holder includes an outer heater 102 (or 107), the lifetime of the outer heater 102 (or 107) is increased, and the productivity is improved.

In the case where a susceptor is used for the wafer holder 50, stress due to temperature difference in the susceptor is reduced, and strain in the susceptor is reduced. This leads to uniformity in the contact between the backside of the wafer 40 and the susceptor. Consequently, the temperature of the wafer 40 is made uniform, and a uniform epitaxial film is obtained.

Eighth Embodiment

Next, an epitaxial wafer manufacturing method is described as an eighth embodiment of the invention.

Figure 20:
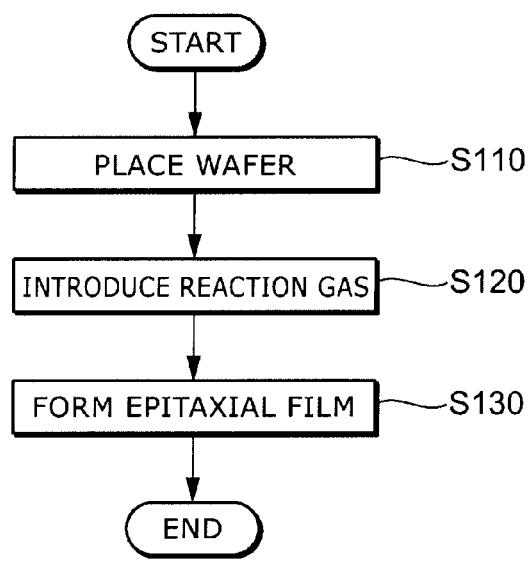
FIG. 20 is a flow chart illustrating the epitaxial wafer manufacturing method according to an eighth embodiment of the invention.

FIG. 20 is a flow chart illustrating the epitaxial wafer manufacturing method according to the eighth embodiment of the invention.

As shown in FIG. 20, in the epitaxial wafer manufacturing method according to the eighth embodiment, first, a wafer 40 illustratively made of silicon is placed on the wafer holder 50, which is located in the upper portion of the rotating unit 70 provided inside the chamber 10 (step S110).

Then, while the wafer 40 is rotated by the rotating unit 70, a reaction gas is introduced into the chamber 10 (step S120). The reaction gas can illustratively be a mixed gas of $SiH_2Cl_2$ serving as a raw material gas of a film to be epitaxially grown, and $H_2$ serving as a carrier gas.

Then, an epitaxial film is formed on the wafer 40 while the flow of the reaction gas is regulated from a position above the wafer holder 50 and inside the outer periphery of the wafer holder 50 to a position below the upper surface of the rotating unit 70 and outside the outer periphery of the rotating unit 70 (step S130).

The flow-regulating walls 200 described in the first to sixth embodiment can illustratively be used for this process.

The wafer 40 can be heated illustratively by the internal heater 100 provided inside the rotating unit 70.

Thus, in the epitaxial wafer manufacturing method according to the eighth embodiment, the flow-regulating wall 200 serves to reduce the backflow rate $V_{in}$ of the reacted gas and decrease the mean age of air, thereby preventing stagnation of the reacted gas. Thus, this embodiment can provide an epitaxial wafer manufacturing method with high productivity by improving film formation rate, gas utilization efficiency, and gas replacement efficiency.

In the foregoing, step S120 and step S130 may be performed simultaneously.

In the above embodiments, the reaction gas can be made of various silicon compounds, such as $SiCl_4$, $SiHCl_3$, $SiH_2Cl_2$, $SiH_3Cl$, and $SiH_4$. The above embodiments are also applicable to the case where the aforementioned raw material gas and a gas such as $H_2$ or HCl are alternately introduced for crystal growth of single crystal silicon, one layer by one layer. Furthermore, as a dopant, a gas of boron compounds such as diborane $B_2H_6$ or phosphorus compounds such as $PH_3$ may be mixed. The epitaxial wafer manufacturing apparatus and manufacturing method according to the present embodiments can stably produce a high-quality epitaxial wafer, improving the quality of semiconductor devices such as ultrahigh-speed bipolar transistors and ultrahigh-speed CMOS and reducing the manufacturing cost.

In the above embodiments, epitaxial growth of a single crystal film of silicon is illustrated. However, the invention is not limited thereto, but applicable to other materials. For example, the invention is also applicable to epitaxial growth of silicon carbide (SiC). Gases for use in this case illustratively include $SiH_4$ as an Si source, $C_3H_8$ as a C source, and $H_2$ as a carrier gas, and can further include $N_2$ as an n-type dopant gas and $Al(CH_3)_3$ as a p-type dopant gas.

On the other hand, according to the invention, thin films of various compounds other than silicon carbide can be formed.

For example, a group III-V compound semiconductor or various other compounds can be formed on a substrate made of a group III-V compound semiconductor or sapphire. In this case, the compound formed is not limited to semiconductors, but may be insulators or dielectrics.

Specifically, for example, the embodiments of the invention are also applicable to epitaxial growth of a film based on gallium arsenide (GaAs), which is used as a constituent material of Schottky diodes and heterojunction bipolar transistors for ultrahigh frequencies and microwaves, and visible-light semiconductor lasers. Gases for use in this case illustratively include organometallic compounds such as trimethylgallium and triethylgallium. Furthermore, various dopant gases can be used.

The epitaxial wafer manufacturing apparatuses and manufacturing methods described as the embodiments of the invention are applicable to various epitaxial wafer manufacturing apparatuses and manufacturing methods based on, for example, reduced-pressure CVD and normal-pressure CVD.

The term "annular" used herein refers to an approximate shape, and includes various modified shapes.

The embodiments of the invention have been described with reference to examples. However, the invention is not limited to these examples. For instance, various specific configurations of the components constituting the epitaxial wafer manufacturing apparatus and manufacturing method are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the epitaxial wafer manufacturing apparatus and manufacturing method described above in the embodiments of the invention, and any epitaxial wafer manufacturing apparatus and manufacturing method thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention.

The invention claimed is:

1. An epitaxial wafer manufacturing apparatus comprising:
a chamber;
a gas introduction port provided in the chamber and configured to introduce a reaction gas into the chamber;
a gas exhaust port provided in the chamber and configured to exhaust the reaction gas from inside the chamber;
a rotating unit provided inside the chamber and having a vertical wall;
a wafer holder provided in an upper portion of the rotating unit and configured to hold a wafer; and
an annular flow-regulating wall being spaced from the rotating unit and the wafer holder, the annular flow-regulating wall surrounding the upper portion of the rotating unit and an upper portion of the wafer holder, and the annular flow-regulating wall including an upper end, a lower end, and a portion extending continuously from the upper end to the lower end,
the upper end being located above the wafer holder, the upper end having an inner circumference smaller than a length of an outer periphery of the wafer holder, and
the lower end being located below an upper surface of the rotating unit, the lower end having an inner circumference greater than a length of an outer periphery of the rotating unit,
wherein:
the reaction gas introduced from the gas introduction port passes through a gap between the flow-regulating wall and the rotating unit via an opening at the upper end of the flow-regulating wall;
a surface of the flow-regulating wall facing the rotating unit is in close proximity to an outer periphery of the upper portion of the rotating unit so that a vertical length of a space above the rotating unit at the outer periphery of the rotating unit is shorter than a vertical length of a space above the rotating unit at a rotation center of the rotating unit;
a horizontal distance between an upper portion of the vertical wall of the rotating unit and the annular flow-regulating wall is shorter than a horizontal distance between a lower portion of the vertical wall of the rotating unit and the annular flow-regulating wall;
the surface of the flow-regulating wall facing the rotating unit is a continuous surface; and
a cross-sectional view of the surface of the flow-regulating wall facing the rotating unit is a continuous line, the cross-sectional view including a plane parallel to a rotational axis of the rotating unit.

2. The manufacturing apparatus according to claim 1, wherein the upper portion of the surface of the flow-regulating wall facing the rotating unit has a shape convex toward the rotating unit, and the lower portion of the surface of the flow-regulating wall facing the rotating unit has a shape concave toward the rotating unit.

3. The manufacturing apparatus according to claim 1, wherein the flow-regulating wall is integrally formed with a liner provided on an inner wall side of the chamber and configured to prevent at least one of contamination from the chamber to the wafer and film adherence to the inner wall of the chamber.

4. The manufacturing apparatus according to claim 1, wherein the flow-regulating wall includes a heater.

5. The manufacturing apparatus according to claim 1, further comprising:
a heater provided on at least one of the rotating unit side of the flow-regulating wall or the side of the flow-regulating wall opposite to the rotating unit.

6. The manufacturing apparatus according to claim 1, wherein the wafer holder is an annular holder configured to hold an outer periphery of the wafer.

7. The manufacturing apparatus according to claim 1, wherein the wafer holder is a susceptor configured to hold a backside of the wafer.

8. The manufacturing apparatus according to claim 1, further comprising:
a heater provided inside the rotating unit.

9. The manufacturing apparatus according to claim 8, wherein the heater includes a disk-shaped inner heater and an annular outer heater provided at an outer periphery of the inner heater.

10. The manufacturing apparatus according to claim 9, wherein the outer heater is located nearer to the wafer holder than the inner heater.

11. An epitaxial wafer manufacturing apparatus comprising:
a chamber;
a gas introduction port provided in the chamber and configured to introduce a reaction gas into the chamber;

a gas exhaust port provided in the chamber and configured to exhaust the reaction gas from inside the chamber;

a rotating unit provided inside the chamber and having a vertical wall; and a wafer holder provided in an upper portion of the rotating unit and configured to hold a wafer, the chamber having an inner wall, the inner wall having an annular flow-regulating wall being spaced from the rotating unit and the wafer holder, the annular flow-regulating wall surrounding the rotating unit and the wafer holder, the annular flow-regulating wall including an upper end, a lower end, and a portion extending continuously from the upper end to the lower end, the upper end being located above the wafer holder, the upper end having an inner circumference smaller than a length of an outer periphery of the wafer holder, and the lower end being located below an upper surface of the rotating unit, the lower end having an inner circumference greater than a length of an outer periphery of the rotating unit, wherein:

the reaction gas introduced from the gas introduction port passes through a gap between the flow-regulating wall and the rotating unit via an opening at the upper end of the flow-regulating wall;

a surface of the flow-regulating wall facing the rotating unit is in close proximity to an outer periphery of the upper portion of the rotating unit so that a vertical length of a space above the rotating unit at the outer periphery of the rotating unit is shorter than a vertical length of a space above the rotating unit at a rotation center of the rotating unit;

a horizontal distance between an upper portion of the vertical wall of the rotating unit and the annular flow-regulating wall is shorter than a horizontal distance between a lower portion of the vertical wall of the rotating unit and the annular flow-regulating wall;

the surface of the flow-regulating wall facing the rotating unit is a continuous surface; and a cross-sectional view of the surface of the flow-regulating wall facing the rotating unit is a continuous line, the cross-sectional view including a plane parallel to a rotational axis of the rotating unit.

12. The manufacturing apparatus according to claim 1, wherein:

the portion extending continuously from the upper end to the lower end curves continuously from the upper end to the lower end;

the surface of the flow-regulating wall facing the rotating unit is a continuous curved surface; and the cross-sectional view of the surface of the flowing-regulating wall facing the rotating unit is a continuous curved line.

* * * * *